(12) United States Patent
Lee et al.

(10) Patent No.: US 12,342,530 B2
(45) Date of Patent: Jun. 24, 2025

(54) TRANSISTOR STRUCTURE INCLUDING OXIDE SEMICONDUCTOR PATTERN SURROUNDING BOTTOM AND SIDEWALL OF GATE AND SEMICONDUCTOR DEVICE USING THE SAME

(71) Applicant: Samsung Electronics Co., Ltd., Suwon-si (KR)

(72) Inventors: Jaepil Lee, Seoul (KR); Minhee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 314 days.

(21) Appl. No.: 18/049,839

(22) Filed: Oct. 26, 2022

(65) Prior Publication Data
US 2023/0269933 A1  Aug. 24, 2023

(30) Foreign Application Priority Data

Feb. 18, 2022  (KR) .................. 10-2022-0021421

(51) Int. Cl.
*H10B 12/00* (2023.01)
*H10D 30/67* (2025.01)
*H10D 62/13* (2025.01)
*H10D 62/80* (2025.01)
*H10D 64/27* (2025.01)

(52) U.S. Cl.
CPC ......... *H10B 12/315* (2023.02); *H10D 62/151* (2025.01); *H10D 62/80* (2025.01)

(58) Field of Classification Search
CPC ................. H10B 12/053; H10B 12/34; H10B 12/315; H10B 12/0335; H10D 62/151; H10D 64/513; H10D 30/6755; H01L 21/823412; H01L 21/823431; H01L 21/823487; H01L 21/823807; H01L 21/823885; H01L 21/823821; H01L 21/845; H01L 29/4236
See application file for complete search history.

(56) References Cited

U.S. PATENT DOCUMENTS

| 5,392,237 | A | * | 2/1995 | Iida ........................ H10B 69/00 365/72 |
| 7,772,632 | B2 | | 8/2010 | Haller et al. |
| 8,779,432 | B2 | | 7/2014 | Yamazaki et al. |
| 9,287,374 | B2 | | 3/2016 | Lee et al. |
| 10,396,082 | B2 | | 8/2019 | Sandhu et al. |

(Continued)

FOREIGN PATENT DOCUMENTS

KR      10-2174333 B1    8/2020

*Primary Examiner* — Sonya McCall-Shepard
(74) *Attorney, Agent, or Firm* — Harness, Dickey & Pierce, P.L.C.

(57) ABSTRACT

A transistor structure including an active pattern defined by a first isolation pattern on a substrate, a second isolation pattern at an upper portion of the active pattern, a gate structure extending through the active pattern and the first isolation pattern, at least a lower portion of the gate structure extending through the second isolation pattern, a first oxide semiconductor pattern on a lower surface and a sidewall of the gate structure, the first oxide semiconductor pattern including In-rich IGZO and at least partially contacting the first and second isolation patterns, and source/drain regions at upper portions of the active pattern adjacent to the gate structure may be provided.

20 Claims, 35 Drawing Sheets

(56) References Cited

U.S. PATENT DOCUMENTS

| | | | |
|---|---|---|---|
| 10,854,612 B2 | 12/2020 | Cho et al. | |
| 2020/0161294 A1 | 5/2020 | Lee et al. | |
| 2021/0091085 A1* | 3/2021 | Yoon | H10D 30/024 |
| 2021/0183865 A1* | 6/2021 | Neelapala | H10B 12/315 |
| 2022/0069205 A1 | 3/2022 | Song | |

* cited by examiner

FIG. 20
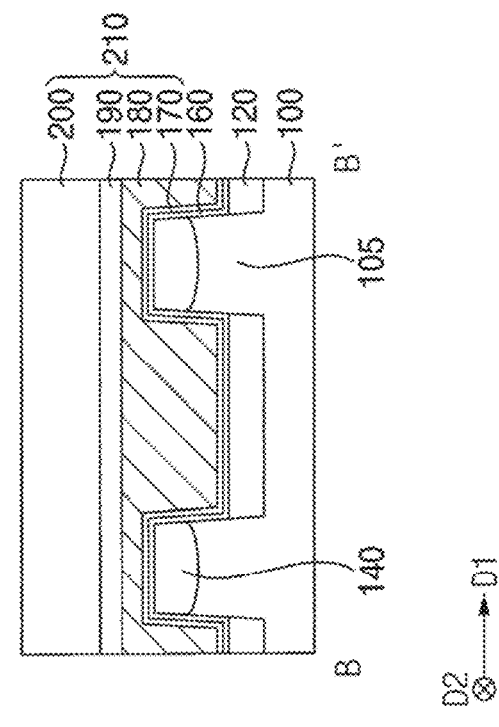
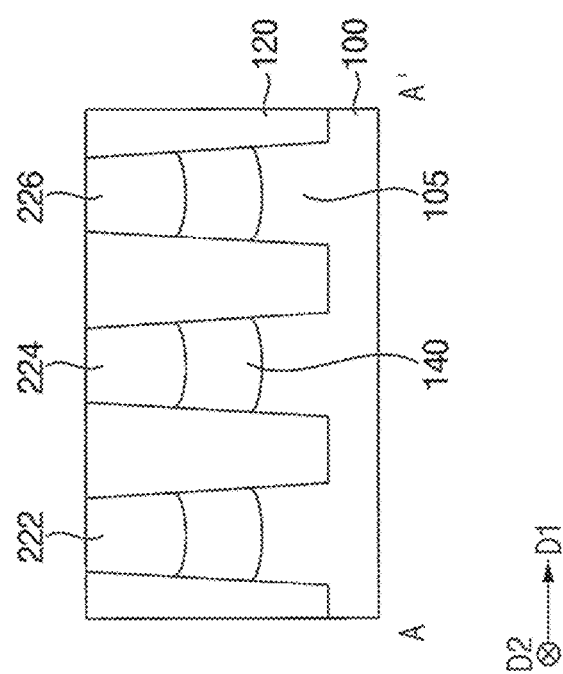

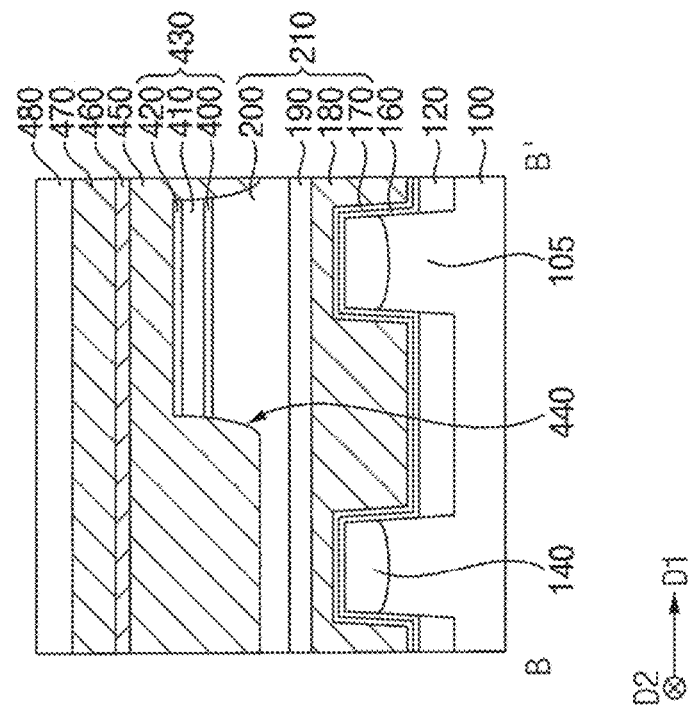
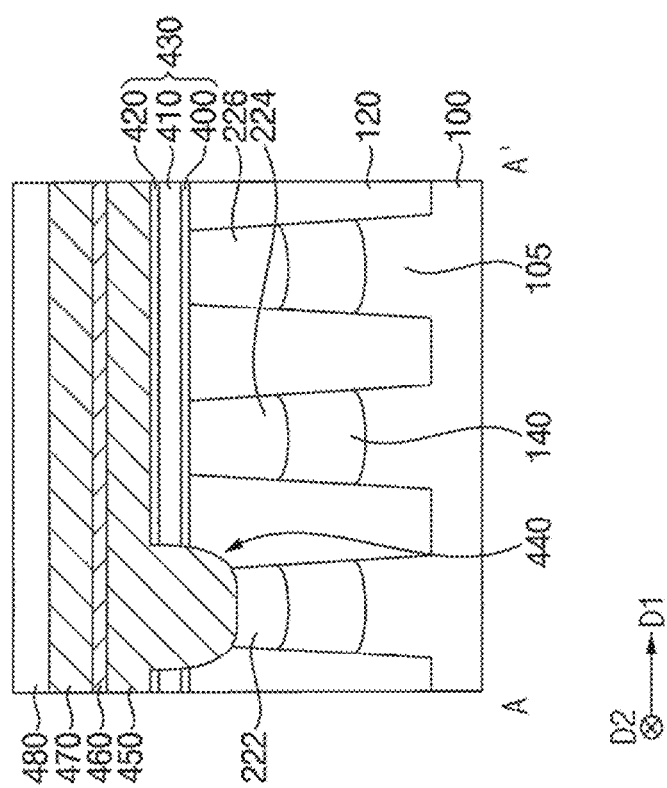
FIG. 23

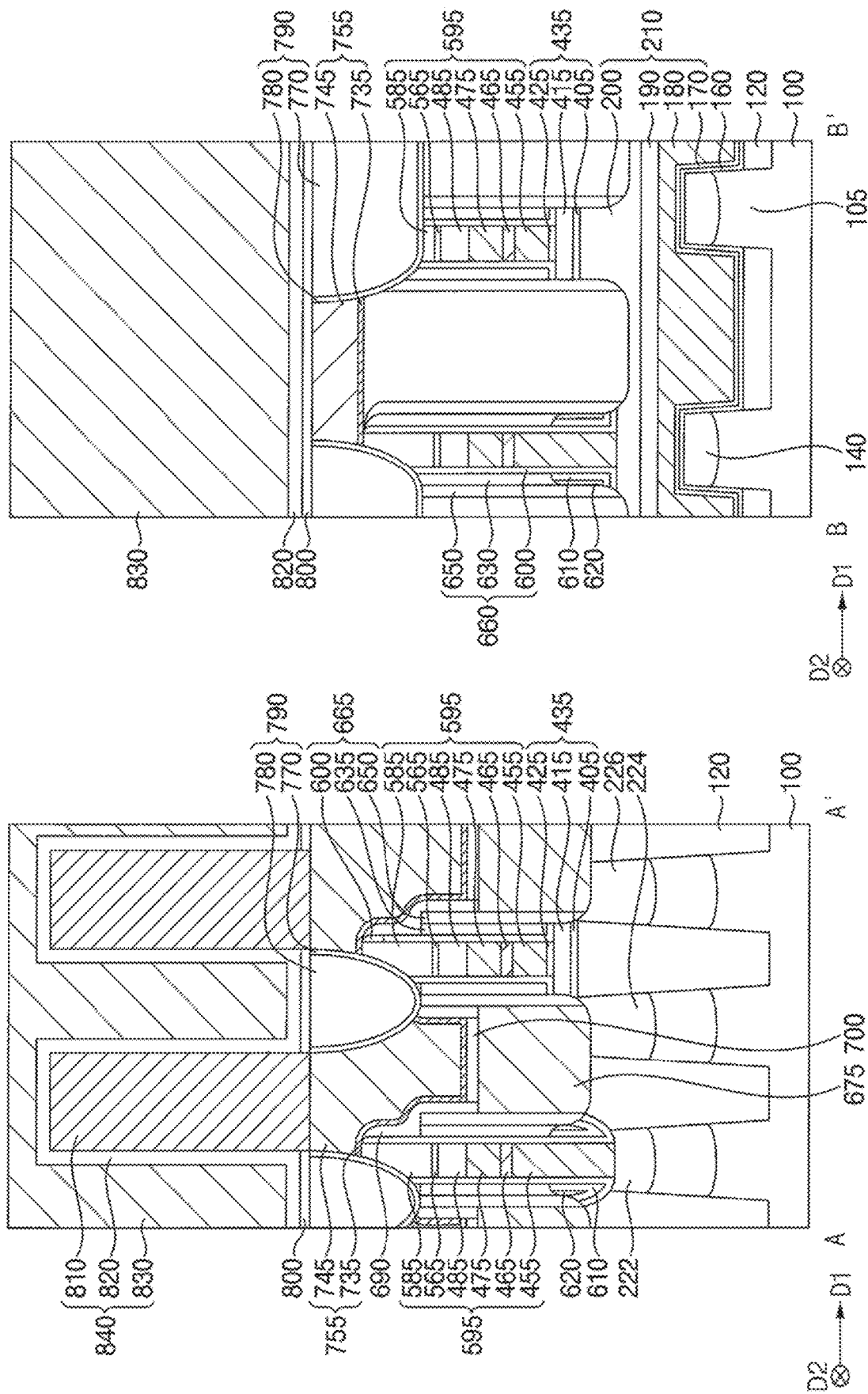

TRANSISTOR STRUCTURE INCLUDING OXIDE SEMICONDUCTOR PATTERN SURROUNDING BOTTOM AND SIDEWALL OF GATE AND SEMICONDUCTOR DEVICE USING THE SAME

CROSS-REFERENCE TO RELATED APPLICATION

This application claims priority under 35 U.S.C. § 119 to Korean Patent Application No. 10-2022-0021421 filed on Feb. 18, 2022 in the Korean Intellectual Property Office, the disclosure of which is hereby incorporated by reference in its entirety.

TECHNICAL FIELD

Example embodiments of the present disclosure relate to transistor structures and/or semiconductor devices including the same. More particularly, example embodiments of the present disclosure relate to transistor structures and/or DRAM devices including the same.

DISCUSSION OF RELATED ART

In a DRAM device, when neighboring gate structures are in an on-mode or an off-mode, charges induced into an active pattern by the on-off operation may not return to the original location, so that data stored in a capacitor electrically connected to a transistor including the gate structures may not be exactly read.

SUMMARY

Some example embodiments provide transistor structures having improved characteristics.

Some example embodiments provide semiconductor devices including a transistor structure having improved characteristics.

According to an example embodiment of the inventive concepts, a transistor structure may include an active pattern defined by a first isolation pattern on a substrate, a second isolation pattern at an upper portion of the active pattern, a gate structure extending through the active pattern and the first isolation pattern, at least a lower portion of the gate structure extending through the second isolation pattern, a first oxide semiconductor pattern on a lower surface and a sidewall of the gate structure, the first oxide semiconductor pattern including In-rich IGZO and at least partially contacting the first and second isolation patterns, and source/drain regions at the upper portion of the active pattern adjacent to the gate structure.

According to an example embodiment of the inventive concepts, a transistor structure may include an active pattern defined by an isolation pattern on a substrate, the active pattern including IGZO, a gate structure extending through the active pattern and the isolation pattern, a first oxide semiconductor pattern on a sidewall of a portion of the active pattern adjacent to the isolation pattern, the first oxide semiconductor pattern including Ga-rich IGZO, and source/drain regions at an upper portion of the active pattern adjacent to the gate structure.

According to an example embodiment of the inventive concepts, a semiconductor device may include an active pattern defined by a first isolation pattern on a substrate, a second isolation pattern at an upper portion of the active pattern, a gate structure extending through the active pattern and the first isolation pattern, at least a lower portion of the gate structure extending through the second isolation pattern in a first direction, the first direction being substantially parallel to an upper surface of the substrate, a first oxide semiconductor pattern on a lower surface and a sidewall of the gate structure, the first oxide semiconductor pattern including In-rich IGZO and at least partially contacting the first and second isolation patterns, source/drain regions at the upper portion of the active pattern adjacent to the gate structure, a bit line structure on one of the source/drain regions and extending in a second direction, the second direction being substantially parallel to the upper surface of the substrate and substantially perpendicular to the first direction, spacer structure on a sidewall of the bit line structure, a contact plug structure on one of the source/drain regions; and a capacitor on the contact plug structure.

The transistor structure in accordance with some example embodiments of the present inventive concepts may include the oxide semiconductor pattern including, for example, IGZO, and thus the leakage current that may be generated by the repeated on-off operation of the neighboring gate structure (e.g., a passing gate) may be reduced or prevented. Additionally, the data recognition error on the capacitor electrically connected to the transistor structure may be mitigated or prevented.

BRIEF DESCRIPTION OF THE DRAWINGS

FIGS. 19 to 35 are plan views and cross-sectional views illustrating a method of manufacturing a semiconductor device in accordance with an example embodiment.

DETAILED DESCRIPTION

Figure 1:
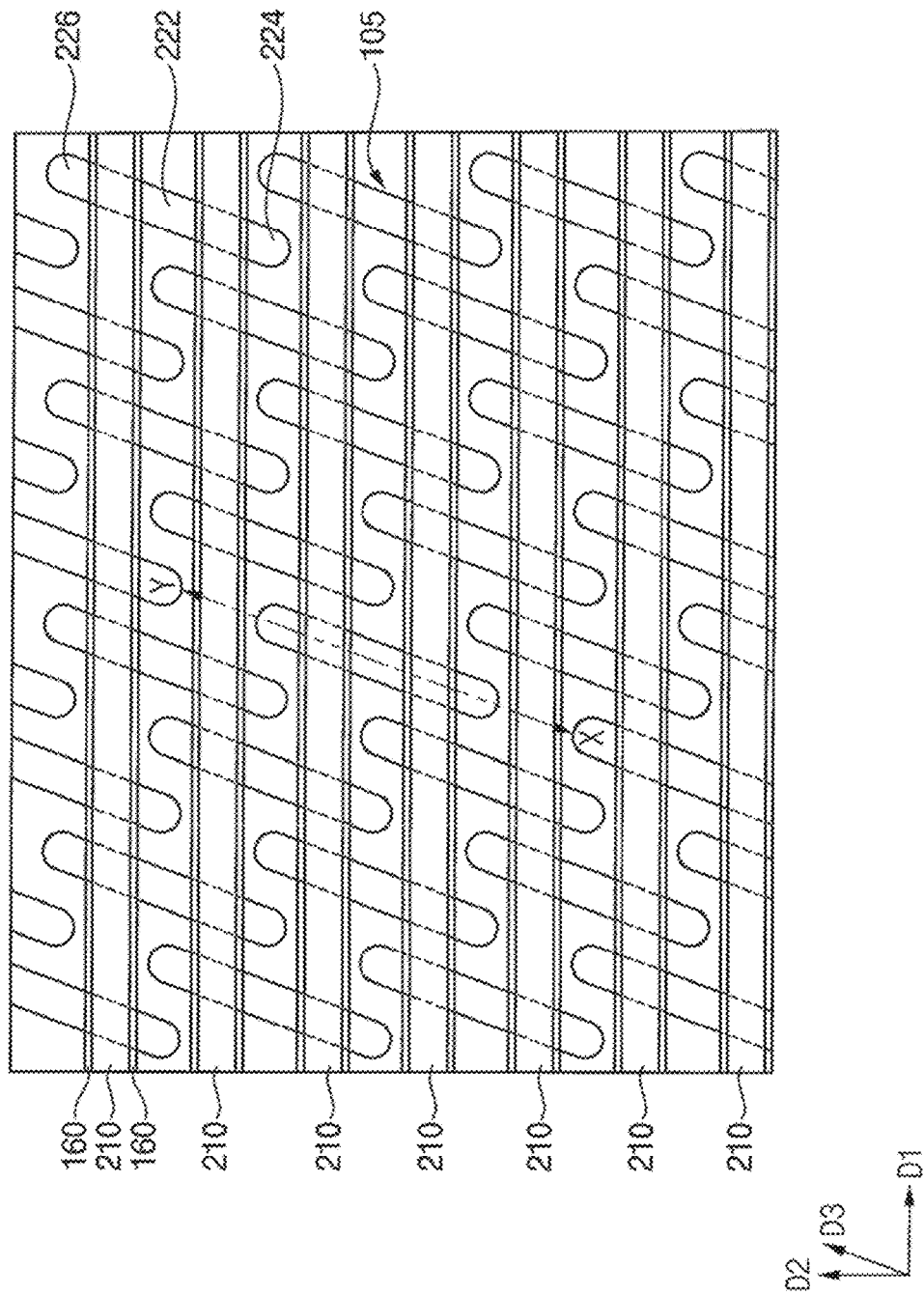
FIGS. 1 and 2 are a plan view and a cross-sectional view, respectively, illustrating a transistor structure in accordance with an example embodiment.

The above and other aspects and features of a transistor structure, methods of forming the transistor structure, semiconductor devices including the transistor structure, and methods of manufacturing the semiconductor device in accordance with some example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of the inventive concepts.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used or no specific word is used in connection with geometric shapes, arrangements of elements, or directions, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, and C" and "A, B, and/or C" means either A, B, C or any combination thereof. (Expressions such as "at least one of," when preceding a list of elements, modify the entire list of elements and do not modify the individual elements of the list.)

Hereinafter, in the specification (and not necessarily in the claims), two directions substantially parallel to an upper surface of a substrate and substantially perpendicular to each other may be referred to as first and second directions D1 and D2, respectively, and a direction substantially parallel to the upper surface of the substrate and having an acute angle with respect to the first and second directions D1 and D2 may be referred to as a third direction D3.

Figure 2:
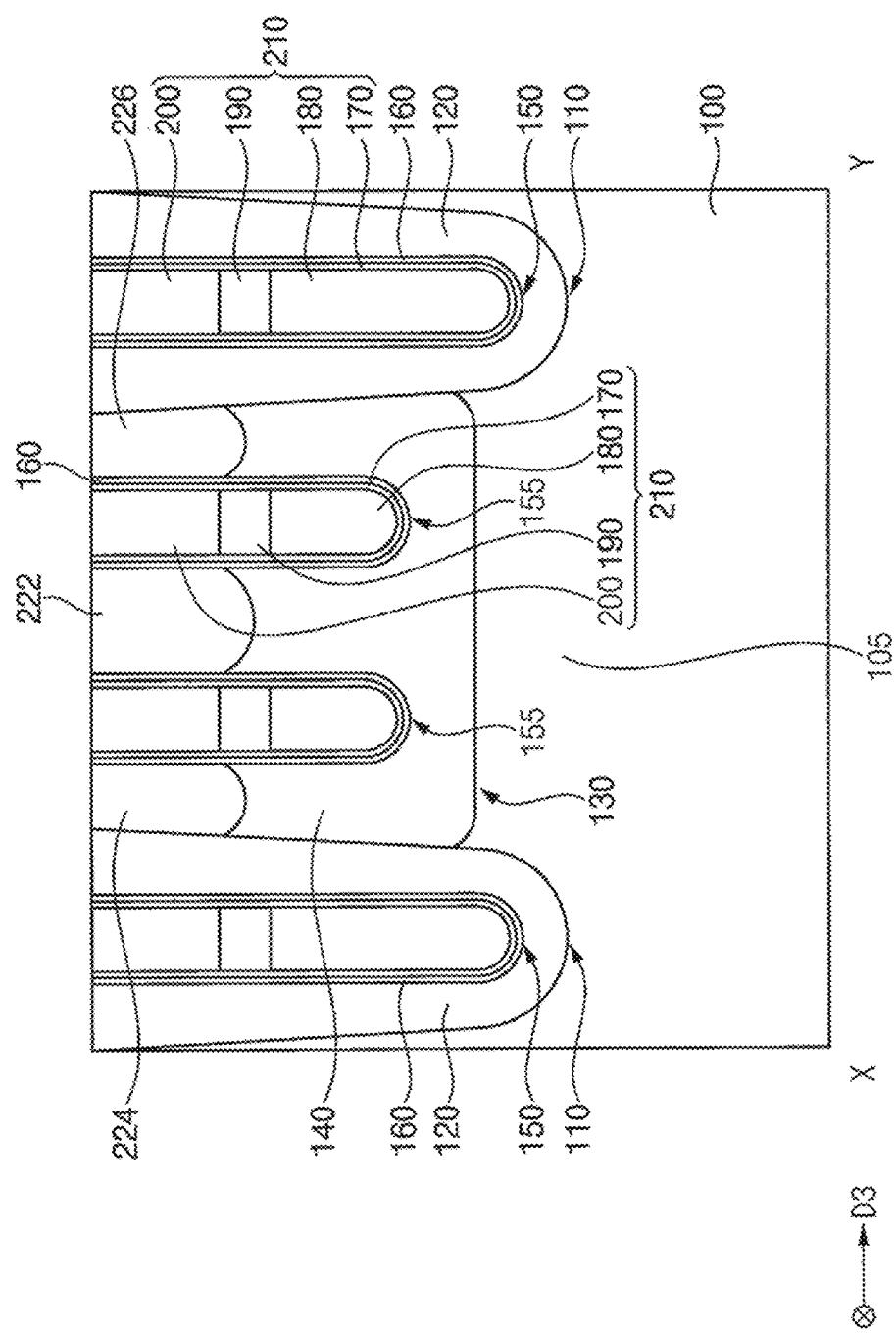

FIGS. 1 and 2 are a plan view and a cross-sectional view, respectively, illustrating a transistor structure in accordance with an example embodiment. FIG. 2 is a cross-sectional view taken along a line X-Y of FIG. 1.

Referring to FIGS. 1 and 2, the transistor structure may include a gate structure 210 in a substrate 100, a first oxide semiconductor pattern 160, and first to third source/drain regions 222, 224 and 226.

The substrate 100 may include a semiconductor material, for example, silicon, germanium, or silicon-germanium.

A first recess 110 may be formed on the substrate 100, and a first isolation pattern 120 may be formed in the first recess 110. A first active pattern 105 may be defined on the substrate 100 by the first isolation pattern 120. In some example embodiments, the first active pattern 105 may extend in the third direction D3 to a given length, and a plurality of first active patterns 105 may be spaced apart from each other in the first and second directions D1 and D2. The isolation pattern 120 may include oxide (e.g., silicon oxide).

A second recess 130 may be formed on the first active pattern 105, and a second isolation pattern 140 may be formed in the second recess 130. The second isolation pattern 140 may include oxide (e.g., silicon oxide).

In some example embodiments, the gate structure 210 may be formed in third and fourth recesses 150 and 155, which may extend through the first isolation pattern 120 and through the first active pattern 105 and the second isolation pattern 140, respectively. A plurality of gate structures 210 may be spaced apart from each other. The third and fourth recesses 150 and 155 may be connected with each other in the first direction D1, and a bottom of the third recess 150 may be deeper than a bottom of the fourth recess 155. Thus, the gate structure 210 may extend in the first direction D1, and a bottom surface of a portion of the gate structure 210 in the first isolation pattern 120 may be deeper than a bottom surface of a portion of the gate structure 210 in the first active pattern 105 and the second isolation pattern 140.

In some example embodiments, the first oxide semiconductor pattern 160 may be formed on the bottoms and sidewalls of the third and fourth recesses 150 and 155, and thus a bottom (e.g., a lower surface) and a sidewall of the gate structure 210 may be surrounded by the first oxide semiconductor pattern 160.

The first oxide semiconductor pattern 160 may include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zincoxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indiumzinc oxide ($Si_zIn_yZn_zO_a$), zinc tin oxide ($Zn_xSn_yO_z$), aluminum zinc tin oxide ($Al_xZa_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO).

In some example embodiments, the first oxide semiconductor pattern 160 may include IGZO (e.g., indium-rich IGZO (In-rich IGZO)).

IGZO is an oxide semiconductor including indium (In), gallium (Ga), zinc (Zn) and oxygen (O), and may have a band gap greater than that of silicon and an off-current less than that of silicon, thereby having low leakage current characteristics. In-rich IGZO has current characteristics higher than those of general IGZO, and thus the first oxide semiconductor pattern 160 including In-rich IGZO may serve as a channel of a transistor.

In some example embodiments, the gate structure 210 may include a first gate electrode 180, a second gate electrode 190, a gate mask 200 sequentially stacked in a vertical direction substantially perpendicular to an upper surface of the substrate 100, and sidewalls of the first and second gate electrodes 180 and 190 and the gate mask 200 and a lower surface of the gate electrode 180 may be covered by a gate insulation pattern 170 on the first oxide semiconductor pattern 160.

The gate insulation pattern 170 may include oxide (e.g., silicon oxide), the first gate electrode 180 may include, for example, metal, metal nitride, or metal silicide, the second gate electrode 190 may include, for example, doped polysilicon, and the gate mask 200 may include nitride (e.g., silicon nitride).

The first to third source/drain regions 222, 224 and 226 may be formed at an upper portion of the first active pattern 105 adjacent to an upper sidewall of the first oxide semiconductor pattern 160 surrounding the gate structure 210.

The first to third source/drain regions 222, 224 and 226 may be spaced apart from each other in the third direction D3. That is, the first source/drain region 222 may be formed at a central portion in the third direction D3 of the first active pattern 105, and the second and third source/drain regions 224 and 226 may be formed at opposite ends in the third direction D3 of the first active pattern 105.

In some example embodiments, the first to third source/drain regions 222, 224 and 226 may include doped polysilicon or doped single crystalline silicon. In some example embodiments, the first to third source/drain regions 222, 224 and 226 may include metal, metal nitride, or metal silicide.

The transistor structure may include a first transistor having a portion of the gate structure 210 extending through the first active pattern 105 and the second isolation pattern 140, the first oxide semiconductor pattern 160 serving as a channel and the first and second source/drain regions 222 and 224, and a second transistor having a portion of the gate structure 210 extending through the first active pattern 105 and the second isolation pattern 140, the first oxide semiconductor pattern 160 serving as a channel and the first and third source/drain regions 222 and 226. Additionally, a portion of the gate structure 210 connected to the portion of the gate structure extending through the first active pattern 105 and the second isolation pattern 140 and extending through the first isolation pattern 120, and the first oxide semiconductor pattern 160 serving as a channel may be collectively referred to as (or may constitute) a third transistor.

Hereinafter, the characteristics of the transistor structure in accordance with some example embodiments and a comparative embodiment are explained.

FIGS. 3 to 8 are cross-sectional views illustrating an operation of a transistor structure in accordance with the comparative embodiment.

This transistor structure may be substantially the same as or similar to the transistor structure of FIGS. 1 and 2, except for not including the first oxide semiconductor pattern 160 and the second isolation pattern 140. In this transistor structure, instead of the first oxide semiconductor pattern 160 including In-rich IGZO and serving as a channel, an upper portion of the first active pattern 105 including single crystalline silicon may serve as a channel.

Figure 3:
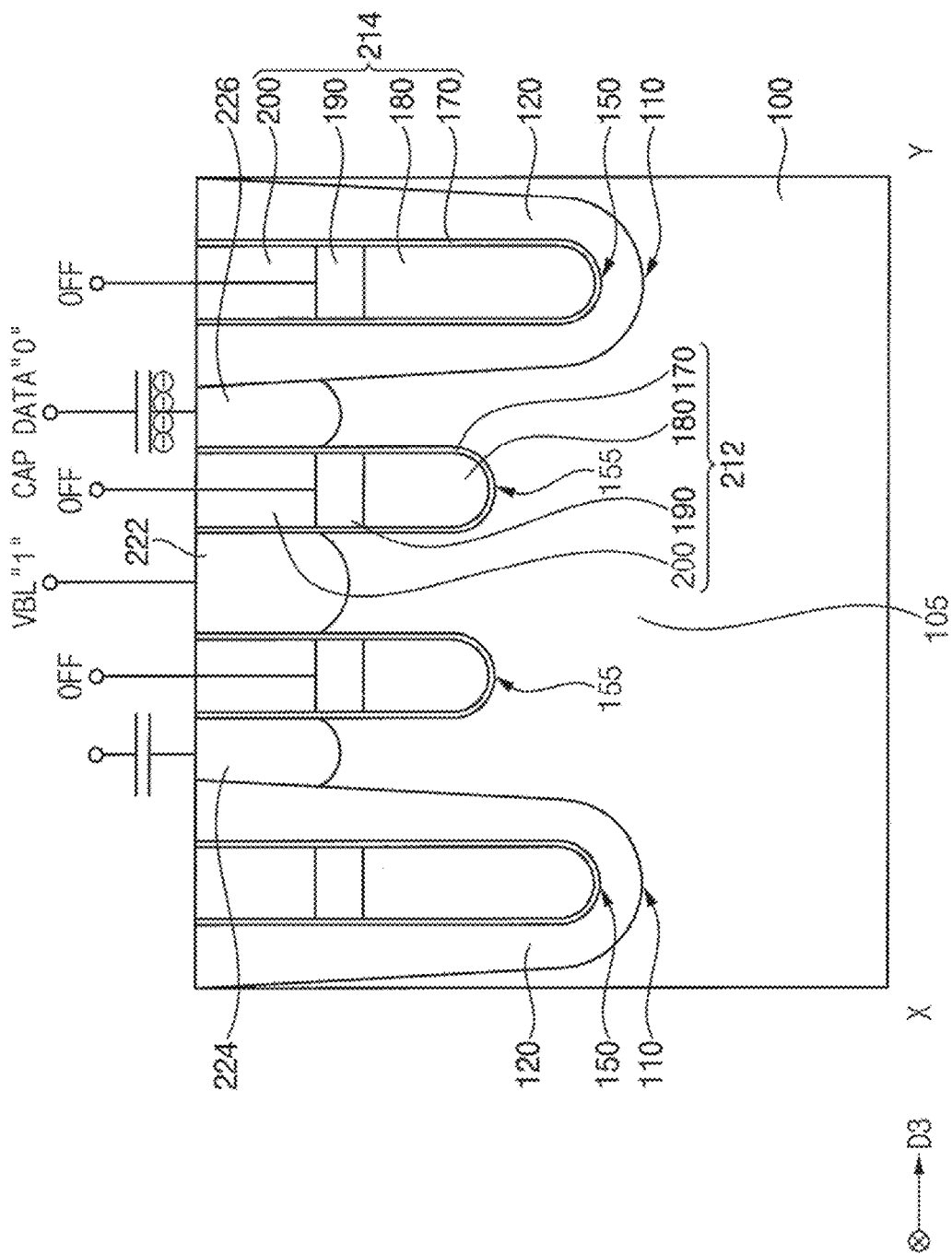
FIGS. 3 to 8 are cross-sectional views illustrating an operation of a transistor structure in accordance with a comparative embodiment.

Referring to FIG. 3, both of the first gate structure 212 in the first active pattern 105 and the second gate structure 214 adjacent to the first gate structure 212 in the third direction D3 and in the first isolation pattern 120 are in an OFF state.

A data of a capacitor CAP electrically connected to the third source/drain region 226, which may serve as a source/drain of a transistor including the first gate structure 212, at a portion of the first active pattern 105 adjacent to the first gate structure 212 and facing the second gate structure 214 may be "0." Data "1" may be applied to a bit line BL electrically connected to the first source/drain region 222 serving as a source/drain of the transistor.

Figure 4:
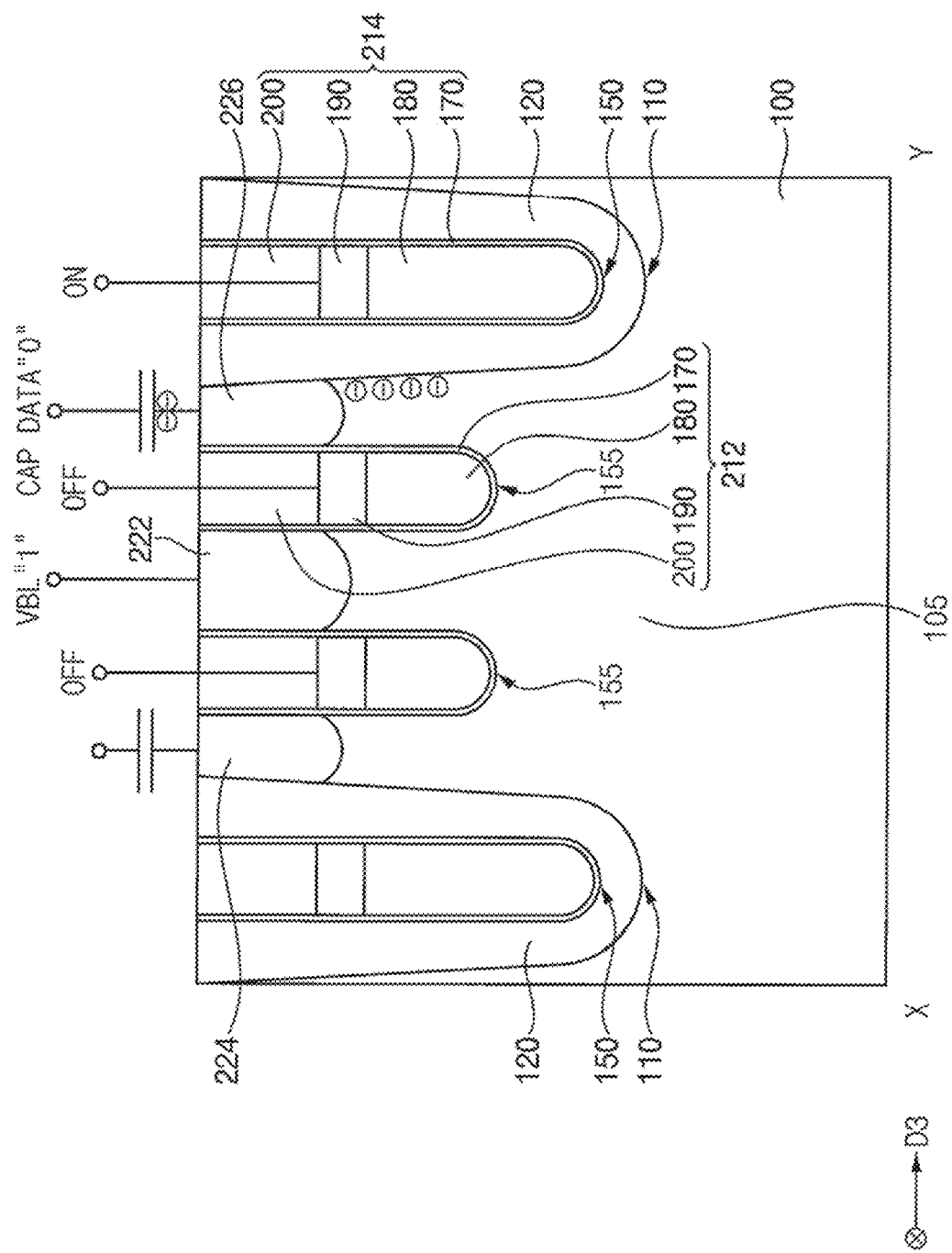

Referring to FIG. 4, when the second gate structure 214 is an ON-state, electrons leaking from the third source/drain region 226 electrically connected to the capacitor CAP may move to a sidewall of the first active pattern 105 adjacent to the second gate structure 214.

Figure 5:
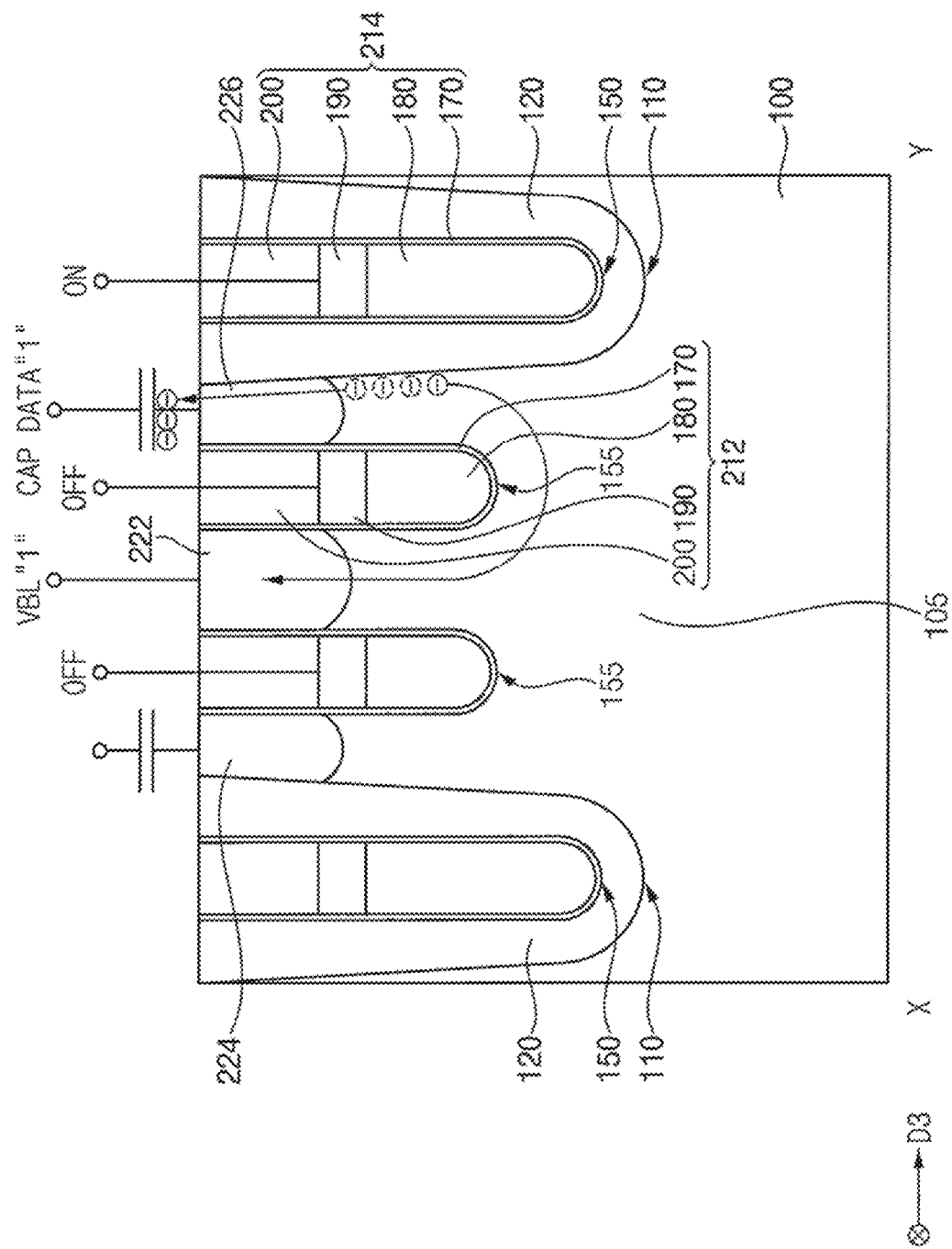

Referring to FIG. 5, when the second gate structure 214 is the OFF state again, most of the electrons that have leaked from the third source/drain region 226 may return to the third source/drain region 226.

However, some of the electrons that have leaked from the third source/drain region 226 may move to the first source/drain region 222 electrically connected to the bit line BL, and thus fewer electrons than the initial electrons stored in the capacitor CAP may remain in the capacitor CAP. Accordingly, data of the capacitor CAP may be recognized not as "0" but "1," which may be referred to as "D0 failure."

Figure 6:
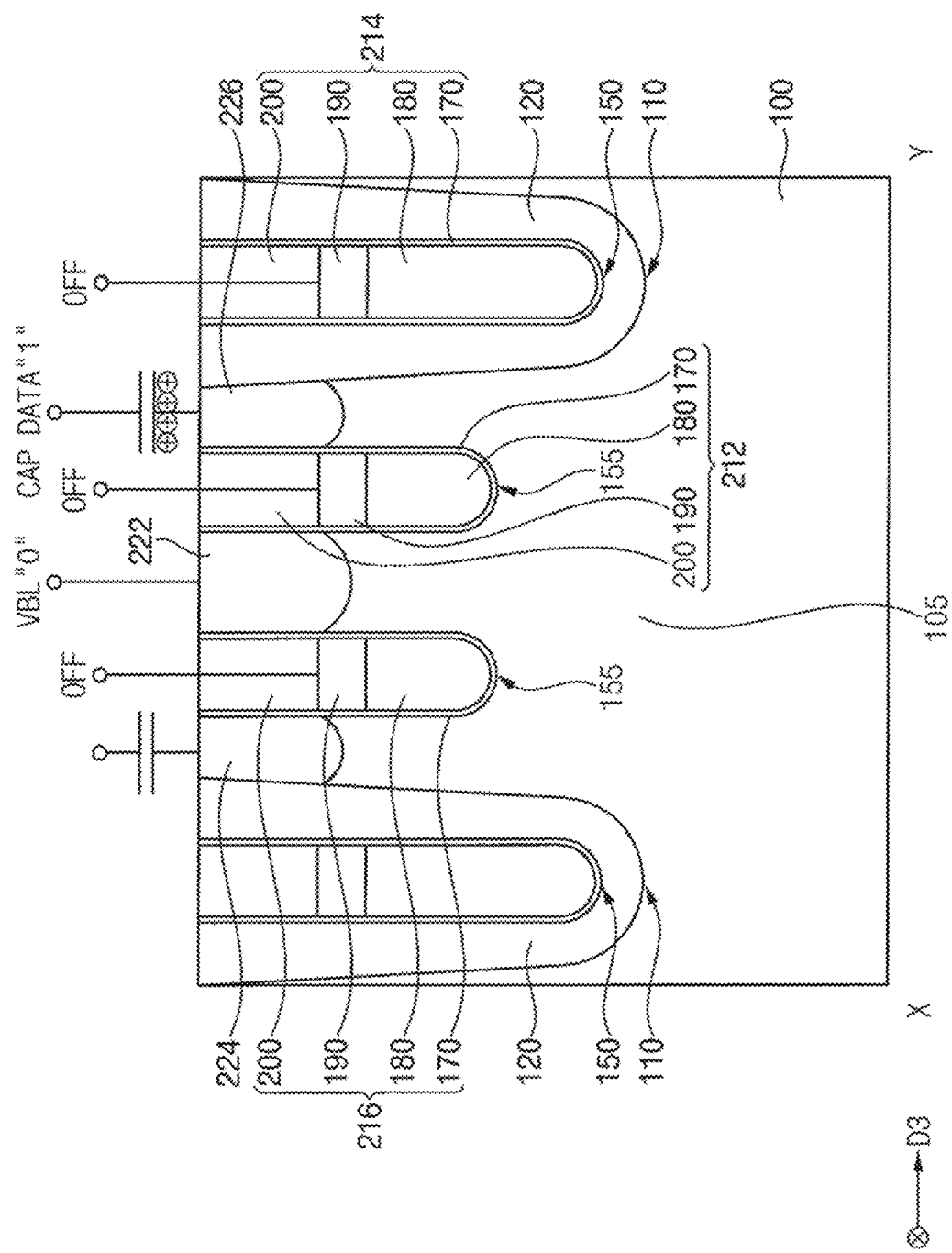

Referring to FIG. 6, both of the first and third gate structures 212 and 216 neighboring in the third direction D3 in the first active pattern 105 and the second gate structure 214 in the first isolation pattern 120 adjacent to the first gate structure 212 in the third direction D3 may be in an OFF state.

A data of the capacitor CAP electrically connected to the third source/drain region 226, which may serve as a source/drain of a transistor including the first gate structure 212, at the portion of the first active pattern 105 adjacent to the first gate structure 212 and facing the second gate structure 214 may be "1." Data "0" may be applied to the bit line BL electrically connected to the first source/drain region 222 serving as a source/drain of the transistor.

Figure 7:
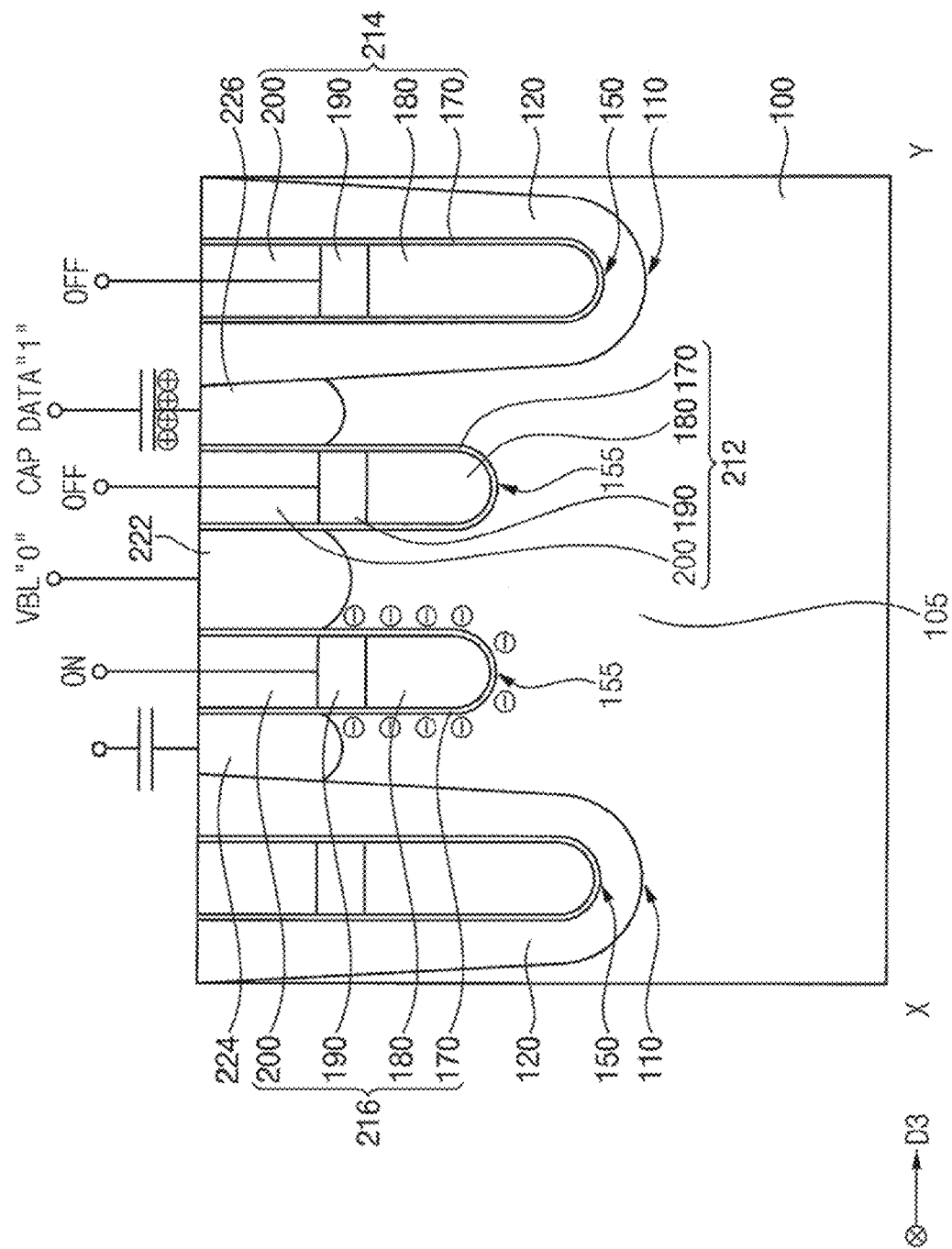

Referring to FIG. 7, when the third gate structure 216 is an ON-state, electrons from the first and second source/drain regions 222 and 224 may move to a portion of the first active pattern 105 adjacent to the third gate structure 216.

Figure 8:
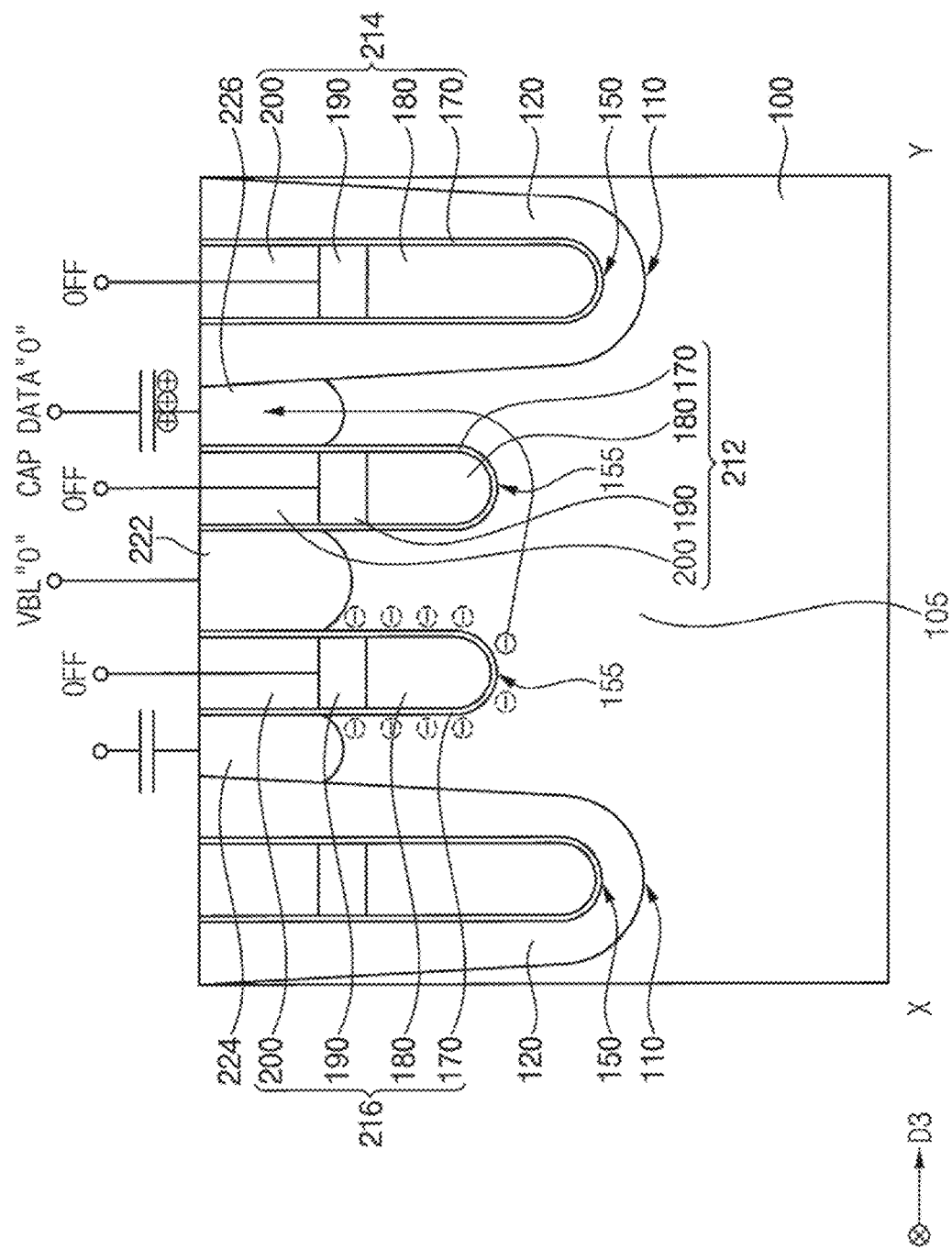

Referring to FIG. 8, when the third gate structure 216 is the OFF state again, most of the electrons that have moved to the portion of the first active pattern 105 adjacent to the third gate structure 216 may return to the first and second source/drain regions 222 and 224.

However, some of the electrons that have moved to the portion of the first active pattern 105 adjacent to the third gate structure 216 may move to the third source/drain region 226, and thus fewer holes than the initial holes stored in the capacitor CAP electrically connected to the third source/drain region 226 may remain in the capacitor CAP. Accordingly, data of the capacitor CAP may be recognized not as "1" but "0," which may be referred to as "D1 failure."

In the transistor structure in the comparative embodiment illustrated with reference to FIGS. 3 to 8, the recognition of the data stored in the capacitor may be wrong due to the on-off operation of the neighboring gate structures, however, in the transistor structure in accordance with some example embodiments, the error of data recognition may be mitigated or prevented from occurring.

That is, transistors in accordance with some example embodiments may include the second isolation pattern 140 at the upper portion of the first active pattern 105 and containing an insulating material, and the gate structures 210 may extend through the first and second isolation patterns 120 and 140. Thus, for example, during the on-off operation of the gate structure 210 extending through the first isolation pattern 120, electrons may not move from the third source/drain region 226 facing the gate structure 210 to the second isolation pattern 140 under the third source/drain region 226, so that the D0 failure may be mitigated or prevented from occurring.

Additionally, during the on-off operation of one of the gate structures 210 extending through the second isolation pattern 140, electrons may not move to the second isolation pattern 140 surrounding the one of the gate structures 210, so that the D1 failure may be mitigated or prevented from occurring.

A lower portion of the gate structure 210 may be surrounded by the first and second isolation patterns 120 and 140 including not a semiconductor material but an insulating material, and thus each of the transistors including one of the gate structures 210 and the two of the first to third source/drain regions 222, 224 and 226 at opposite sides of the one of the gate structures 210 may further include the first oxide semiconductor pattern 160 on the sidewall and the lower surface of the one of the gate structures 210 and including In-rich IGZO, which may serve as a channel of each of the transistors.

The transistor structure may be formed by following processes.

For example, the first recess 110 may be formed on the substrate 100 to define the first active pattern 105 on the substrate 100, the first isolation pattern 120 may be formed in the first recess 110, an upper portion of the first active pattern 105 may be removed to form the second recess 130, and the second isolation pattern 140 may be formed in the second recess 130.

The third and fourth recesses 150 and 155 may be formed through the first isolation pattern 120, and through the first active pattern 105 and the second isolation pattern 140, respectively, the first oxide semiconductor pattern 160 may be formed on the bottoms and the sidewalls of the third and fourth recesses 150 and 155, and the gate structure 210 may be formed on the first oxide semiconductor pattern 160. The gate structure 210 may be formed by forming the gate insulation pattern 170 on the first oxide semiconductor pattern 160, forming the first and second gate electrodes 180 and 190 stacked in the vertical direction in lower portions of the third and fourth recesses 150 and 155, and forming the gate mask 200 on the gate electrode 190 to fill the upper portion of the third and fourth recesses 150 and 155.

For example, n-type impurities may be doped into the upper portion of the first active pattern 105 adjacent to the gate structure 210 to form the first to third source/drain regions 222, 224 and 226. In some example embodiments, an upper portion of the second isolation pattern 140 adjacent to the gate structure 210 may be removed to form fifth recesses, and the first to third source drain regions 222, 224 and 226 may be formed in the fifth recesses, respectively.

Figure 9:
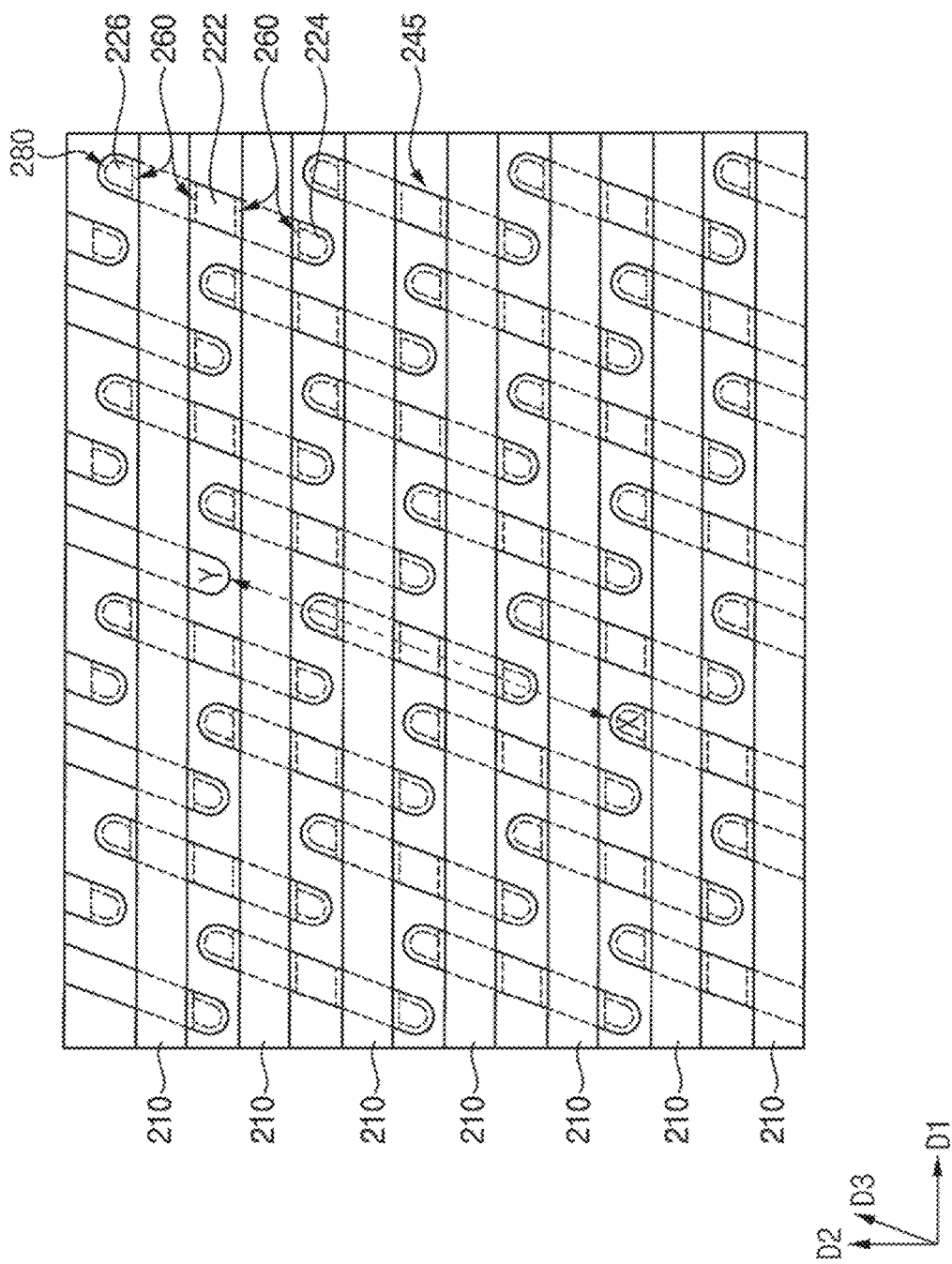
FIGS. 9 and 10 are a plan view and a cross-sectional view, respectively, illustrating a transistor structure in accordance with an example embodiment.
Figure 10:
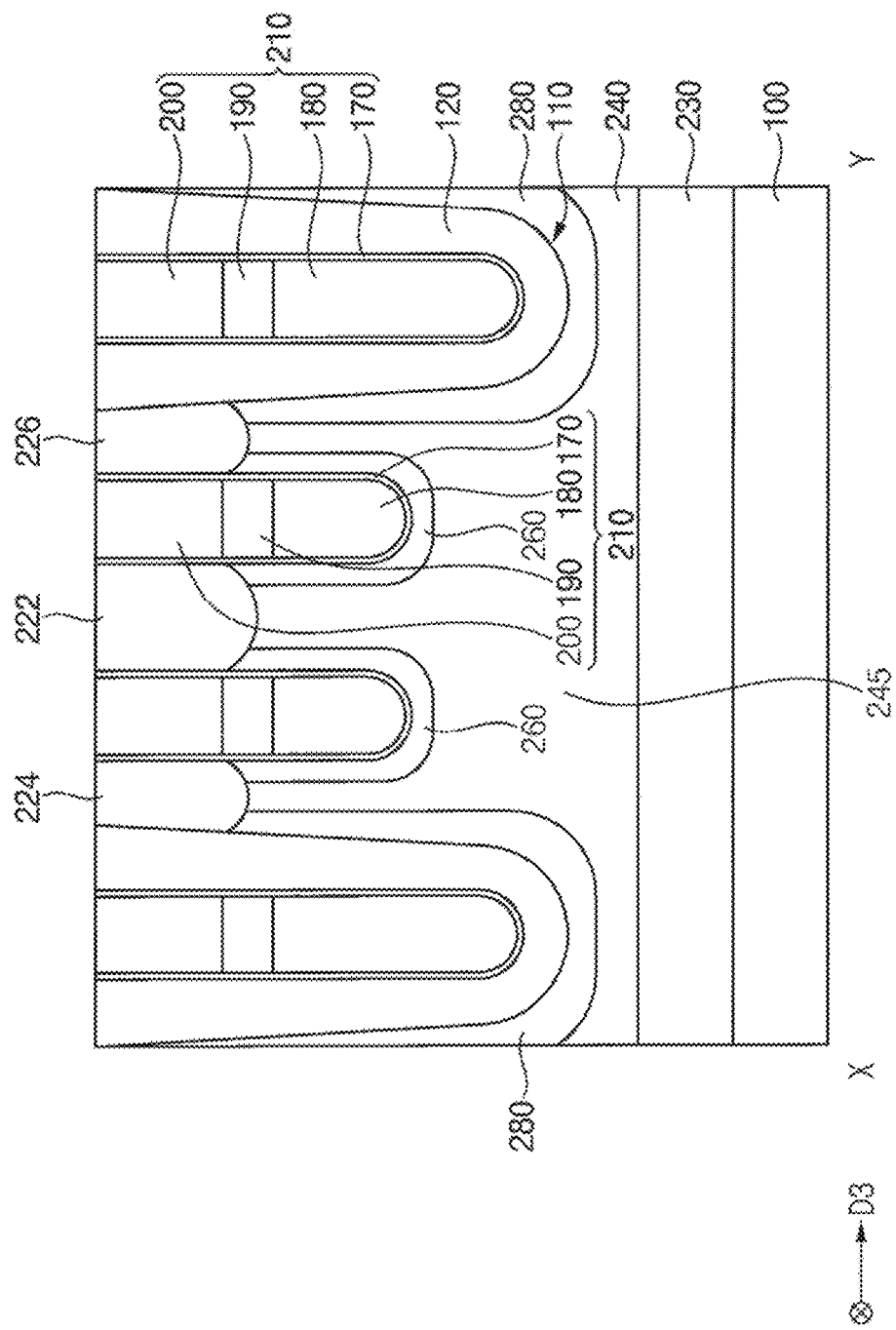

FIGS. 9 and 10 are a plan view and a cross-sectional view, respectively, illustrating a transistor structure in accordance with an example embodiment, and may correspond to FIGS. 1 and 2, respectively. This transistor structure may include elements substantially the same as or similar to those of FIGS. 1 and 2, and thus repeated explanations thereof are omitted herein.

Referring to FIGS. 9 and 10, the transistor structure may include a buried oxide layer 230 and a fourth oxide semiconductor layer 240 on the buried oxide layer 230. Additionally, the transistor structure may include the gate structure 210, second and third oxide semiconductor patterns 260 and 280, and the first to third source/drain regions 222, 224 and 226.

The buried oxide layer 230 may include oxide (e.g., silicon oxide).

The fourth oxide semiconductor layer 240 may include, for example, at least one of ZTO, IZO, $ZnO_x$, IGZO, IGSO, indium oxide, $SnO_2$, $TiO_x$, $Zn_xO_yN_z$, $Mg_xZn_yO_z$, $In_xZn_yO_a$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_dO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$ and InGaSiO, as the first oxide semiconductor pattern 160. In some example embodiments, the fourth oxide semiconductor layer 240 may include IGZO.

The first recess 110 may be formed on the fourth oxide semiconductor layer 240, and the first isolation pattern 120 may be formed in the first recess 110. A second active pattern 245 may be defined by the first isolation pattern 120 on the fourth semiconductor layer 240. In some example embodiments, the second active pattern 245 may extend in the third direction D3 to a given length, and a plurality of second active patterns 245 may be spaced apart from each other in the first and second directions D1 and D2. That is, the second active pattern 245 may have a shape and a layout substantially the same as or similar to those of the first active pattern 105. The second active pattern 245 may include IGZO.

The gate structure 210 may extend through the second active pattern 245 and the first isolation pattern 120 in the first direction D1, and a plurality of gate structures 210 may be spaced apart from each other in the second direction D2.

The first to third source/drain regions 222, 224 and 226 may be formed on the second active pattern 245 adjacent to the gate structure 210. In some example embodiments, the first to third source/drain regions 222, 224 and 226 may include, for example, metal, metal nitride, or metal silicide.

The second oxide semiconductor pattern 260 may surround a sidewall and a bottom surface of a portion of the gate structure extending through the second active pattern 245, and may be formed under the first to third source/drain regions 222, 224 and 226.

The third oxide semiconductor pattern 280 may be formed at a portion of the second active pattern 245 adjacent to the first isolation pattern 120, and may surround a lower surface and a lower sidewall of the first isolation pattern 120. The third oxide semiconductor pattern 280 may be formed under the second and third source/drain regions 224 and 226.

The second and third oxide semiconductor patterns 260 and 280 may include, for example, at least one of ZTO, IZO, $ZnO_x$, IGZO, IGSO, indium oxide, $SnO_2$, $TiO_x$, $Zn_xO_yN_z$, $Mg_xZn_yO_z$, $In_xZn_yO_a$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_dO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$ and InGaSiO, as the first oxide semiconductor pattern 160.

In some example embodiments, the second oxide semiconductor pattern 260 may include indium-rich IGZO (In-rich IGZO), and the third oxide semiconductor pattern 280 may include gallium-rich IGZO (Ga-rich IGZO). Gallium may have a high reactivity with oxygen, and thus Ga-rich IGZO may have a high insulating property, thereby reducing the movement of electrons.

In the transistor structure, the gate structure 210 may extend through the second active pattern 245 including IGZO having leakage current characteristics lower than that of silicon, and thus the D1 failure may be mitigated or prevented. Further, the second oxide semiconductor pattern 260 including In-rich IGZO, which has current characteristics higher than that of IGZO, is provided on the lower surface and the sidewall of the gate structure 210, and may serve as a channel of each transistor including each gate structure 210 and two of the first to third source/drain regions 222, 224 and 226.

Additionally, the third oxide semiconductor pattern 280 including Ga-rich IGZO may be formed on the sidewall of the second active pattern 245 adjacent to the first isolation pattern 120, thereby mitigating or preventing the D0 failure.

The transistor structure may be formed by following processes.

For example, an upper silicon layer included in silicon-on-insulator (SOI) substrate 100 may be removed to expose the buried oxide layer 230, and the fourth oxide semiconductor layer 240 may be formed on the buried oxide layer 230.

The first recess 110 may be formed on the fourth oxide semiconductor layer 240 to define the second active pattern 245, a portion of the second active pattern 245 adjacent to the first recess 110 may be further removed to enlarge the first recess 110, and the third oxide semiconductor pattern 280 may be formed on the sidewall and the bottom of the enlarged first recess 110 by, for example, an atomic layer deposition (ALD) process. The first isolation pattern 120 may be formed on the third oxide semiconductor pattern 280 to fill the first recess 110.

An upper portion of the second active pattern 245 may be removed to form a sixth recess, and the second oxide semiconductor pattern 260 may be formed in the sixth recess.

The gate structure 210 may be formed through the first isolation pattern 120 and the second oxide semiconductor pattern 260, the upper portion of the second active pattern 245 and the second and third oxide semiconductor patterns 260 and 280 adjacent to the gate structure 210 may be removed to form seventh recesses, and the first to third source/drain regions 222, 224 and 226 may be formed in the seventh recesses.

Figure 11:
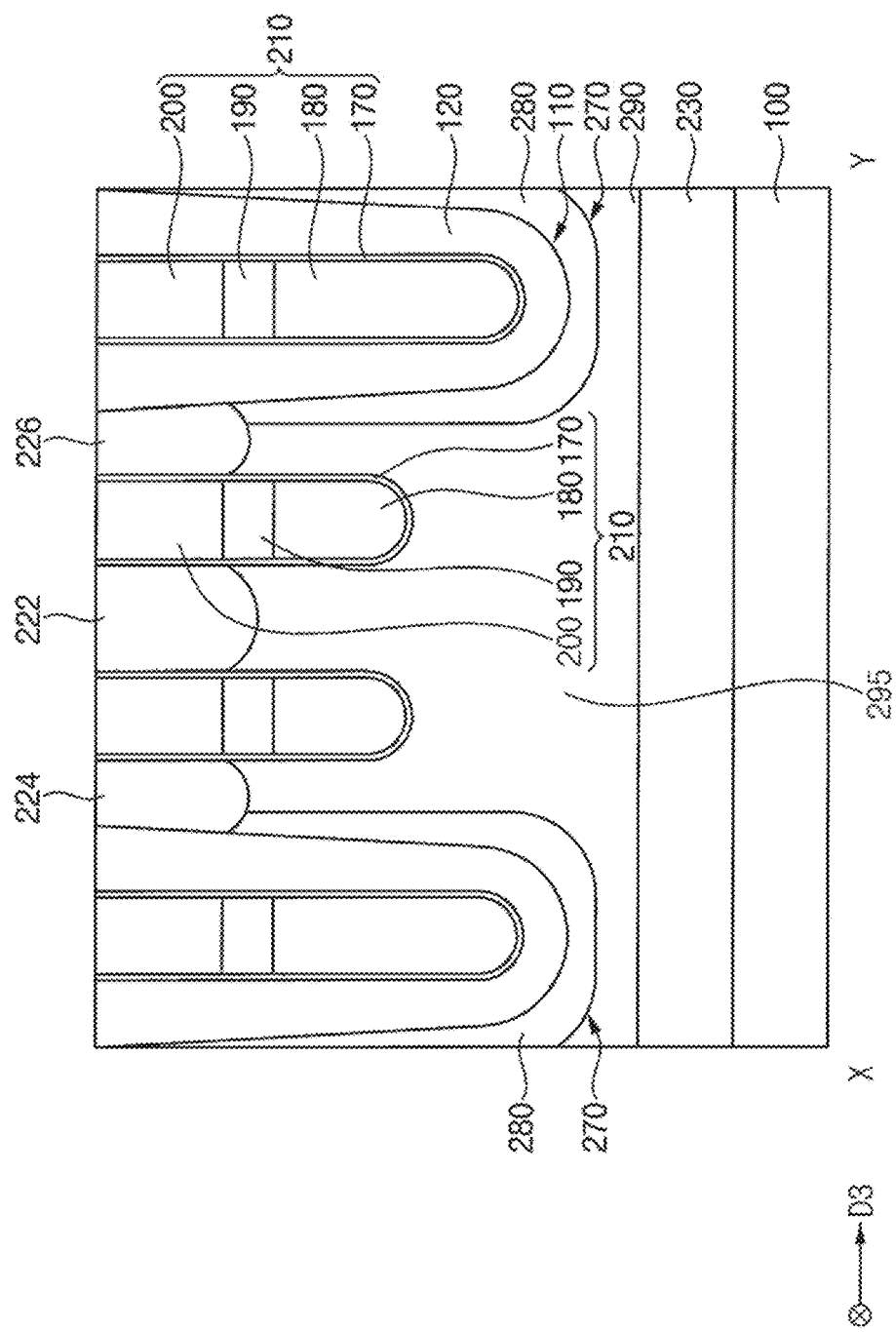
FIG. 11 is a cross-sectional view illustrating a transistor structure in accordance with an example embodiment.

FIG. 11 is a cross-sectional view illustrating a transistor structure in accordance with an example embodiment, and may correspond to FIG. 10. This transistor structure may be substantially the same as or similar to that of FIGS. 9 and 10, except for including a fifth oxide semiconductor layer 290 instead of the fourth oxide semiconductor layer 240, and not including the second oxide semiconductor pattern 260. Thus, repeated explanations of the same elements are omitted herein.

Referring to FIG. 11, the transistor structure may include the buried oxide layer 230 on the substrate 100 and the fifth oxide semiconductor layer 290 on the buried oxide layer 230. The transistor structure may further include the gate structure 210, the third oxide semiconductor pattern 280, and the first to third source/drain regions 222, 224 and 226.

The fifth oxide semiconductor layer 290 may include, for example, at least one of ZTO, IZO, $ZnO_x$, IGZO, IGSO, indium oxide, $SnO_2$, $TiO_x$, $Zn_xO_yN_z$, $Mg_xZn_yO_z$, $In_xZn_yO_a$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_2$ and InGaSiO, as the first oxide semiconductor pattern 160. In some example embodiments, the fifth oxide semiconductor layer 290 may include, for example, In-rich IGZO.

The first recess 110 may be formed on the fifth oxide semiconductor layer 290, and the first isolation pattern 120 may be formed in the first recess 110. A third active pattern 295 may be defined on the fifth oxide semiconductor layer 290 by the first isolation pattern 120. In some example embodiments, the third active pattern 295 may have a shape and a layout substantially the same as or similar to those of the first and second active patterns 105 and 245.

The gate structure 210 may extend through the third active pattern 295 and the first isolation pattern 120 in the first direction D1, and a plurality of gate structures 210 may be spaced apart from each other in the second direction D2.

The first to third source/drain regions 222, 224 and 226 may be formed on the third active pattern 295 adjacent to the sidewall of the gate structure 210. In some example embodiments, the first to third source/drain regions 222, 224 and 226 may include a conductive material, for example, metal, metal nitride, or metal silicide.

The third oxide semiconductor pattern 280 may be formed on a portion of the third active pattern 295 adjacent to the first isolation pattern 120, and may surround a lower surface and a lower sidewall of the first isolation pattern 120. In some example embodiments, the third oxide semiconductor pattern 280 may include Ga-rich IGZO.

The transistor structure may include the gate structure 210 extending through the third active pattern 295 including In-rich IGZO, which may have leakage current characteristics lower than that of silicon, and thus the D1 failure may be mitigated or prevented. In-rich IGZO may have current characteristics higher than that of IGZO, and thus may serve as a channel.

Additionally, the third oxide semiconductor pattern 280 including Ga-rich IGZO may be formed on the sidewall of the third active pattern 295 adjacent to the first isolation pattern 120, and thus the D0 failure may be mitigated or prevented.

Figure 12:
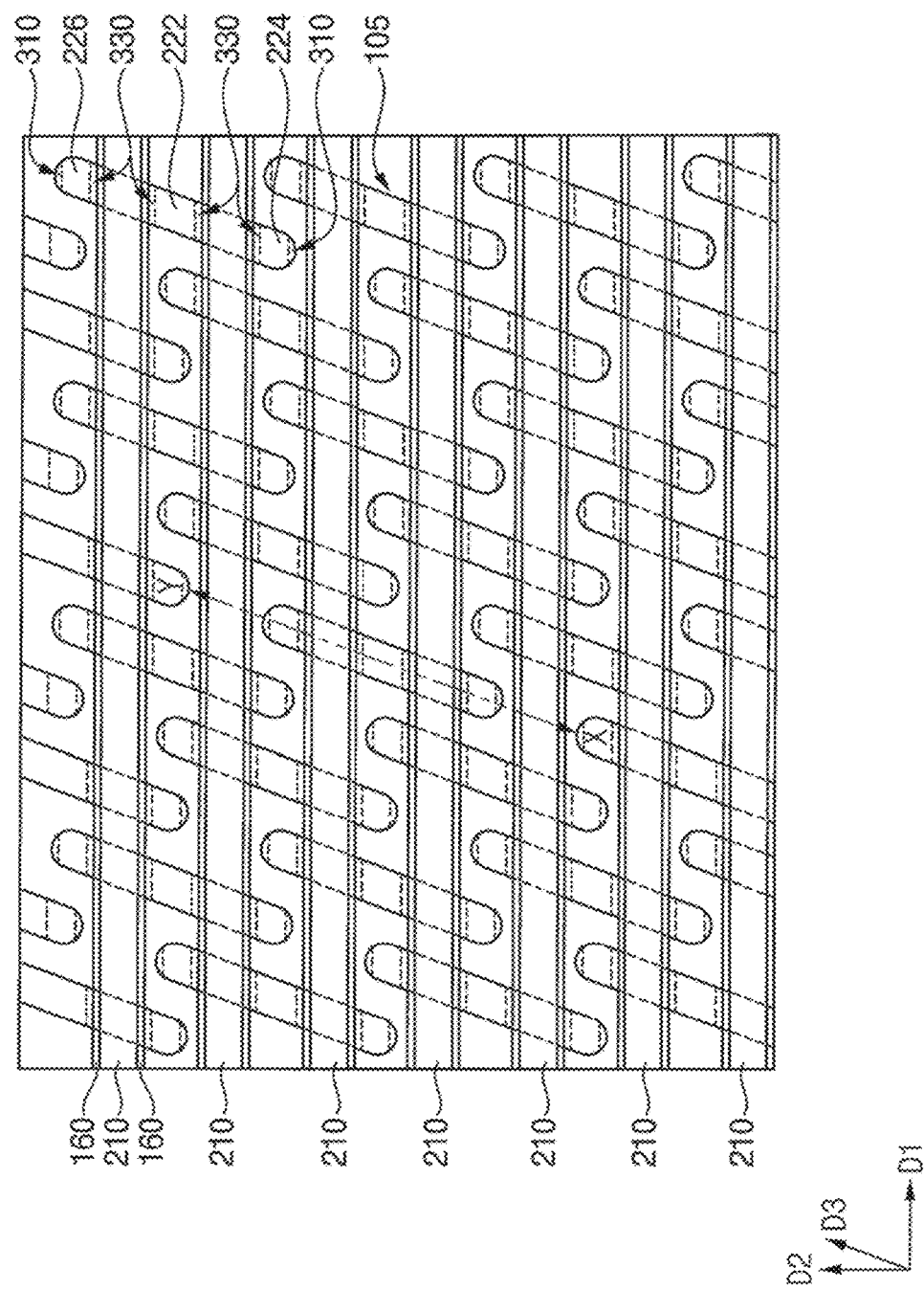
FIGS. 12 and 13 are a plan view and a cross-sectional view, respectively, illustrating a transistor structure in accordance with an example embodiment.
Figure 13:
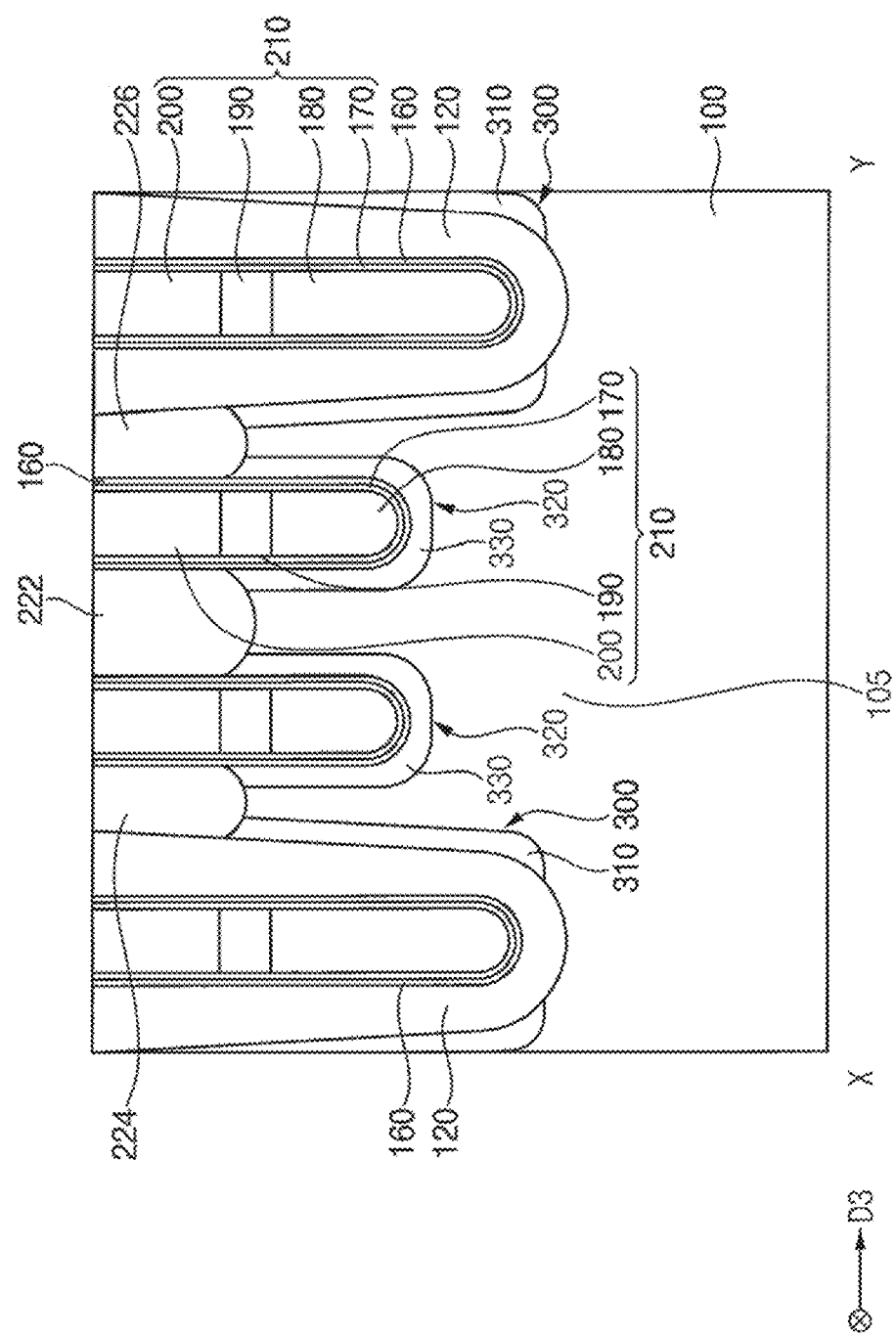

FIGS. 12 and 13 are a plan view and a cross-sectional view, respectively, illustrating a transistor structure in accordance with an example embodiment, and may correspond to FIGS. 1 and 2, respectively.

This transistor structure may be substantially the same as or similar to that of FIGS. 9 and 10, except for including a third isolation pattern 330 instead of the second isolation pattern 140, and further including a sixth oxide semiconductor pattern 310. Thus, repeated explanations of the same elements are omitted herein.

Referring to FIGS. 12 and 13, the transistor structure may include the gate structure 210, the first oxide semiconductor pattern 160, and the first to third source/drain regions 222, 224 and 226 in the substrate 100. Additionally, the transistor structure may include the third isolation pattern 330 and the sixth oxide semiconductor pattern 310.

An eighth recess 320 may be formed on the first active pattern 105, and the third isolation pattern 330 may be formed in the eighth recess 320. The third isolation pattern 330 may include oxide (e.g., silicon oxide).

In some example embodiments, the gate structure 210 may penetrate the first isolation pattern 120, the first active pattern 105 and the third isolation pattern 330, and the first oxide semiconductor pattern 160 may be formed on the sidewall and the lower surface of the gate structure 210.

The first to third source/drain regions 222, 224 and 226 may be formed at the upper portion of the first active pattern 105 adjacent to an upper sidewall of the first oxide semiconductor pattern 160 surrounding the gate structure 210. The first to third source/drain regions 222, 224 and 226 may be spaced apart from each other in the third direction D3. In an example embodiment, the first to third source/drain regions 222, 224 and 226 may include doped polysilicon or doped single crystalline silicon. In some example embodiments, the first to third source/drain regions 222, 224 and 226 may include a conductive material (e.g., metal, metal nitride, or metal silicide).

The sixth oxide semiconductor pattern 310 may be formed on a sidewall of a ninth recess 300, which may be formed at opposite sides of the first active patterns 105 facing each other in the third direction D3, and may contact a sidewall of the first isolation pattern 120. The sixth oxide semiconductor layer 310 may include, for example, at least one of ZTO, IZO, $ZnO_x$, IGZO, IGSO, indium oxide, $SnO_2$, $TiO_x$, $Zn_xO_yN_z$, $Mg_xZn_yO_z$, $In_xZn_yO_a$, $In_xGa_yZn_zO_a$, $Zr_xIn_yZn_zO_a$, $Hf_xIn_yZn_zO_a$, $Sn_xIn_yZn_zO_a$, $Al_xSn_yIn_zZn_aO_d$, $Si_xIn_yZn_zO_a$, $Zn_xSn_yO_z$, $Al_xZn_ySn_zO_a$, $Ga_xZn_ySn_zO_a$, $Zr_xZn_ySn_zO_a$ and InGaSiO, as the first oxide semiconductor pattern 160. In some example embodiments, the sixth oxide semiconductor layer 310 may include Ga-rich IGZO.

In the transistor structure, the sidewall and the lower surface of the portion of the gate structure 210 in the first active pattern 105 may be covered by the third oxide semiconductor pattern 330, thereby mitigating or preventing the D1 failure. Additionally, the sixth oxide semiconductor pattern 310 may be formed on the sidewall of the first active pattern 105 adjacent to the portion of the gate structure 210 in the first active pattern 120, thereby mitigating or preventing the D0 failure. The first oxide semiconductor pattern 160 on the lower surface and the sidewall of the gate structure 210 may include In-rich IGZO, and may serve as a channel of the transistor structure.

Hereinafter, a method of forming the transistor structure is illustrated.

Figure 14:
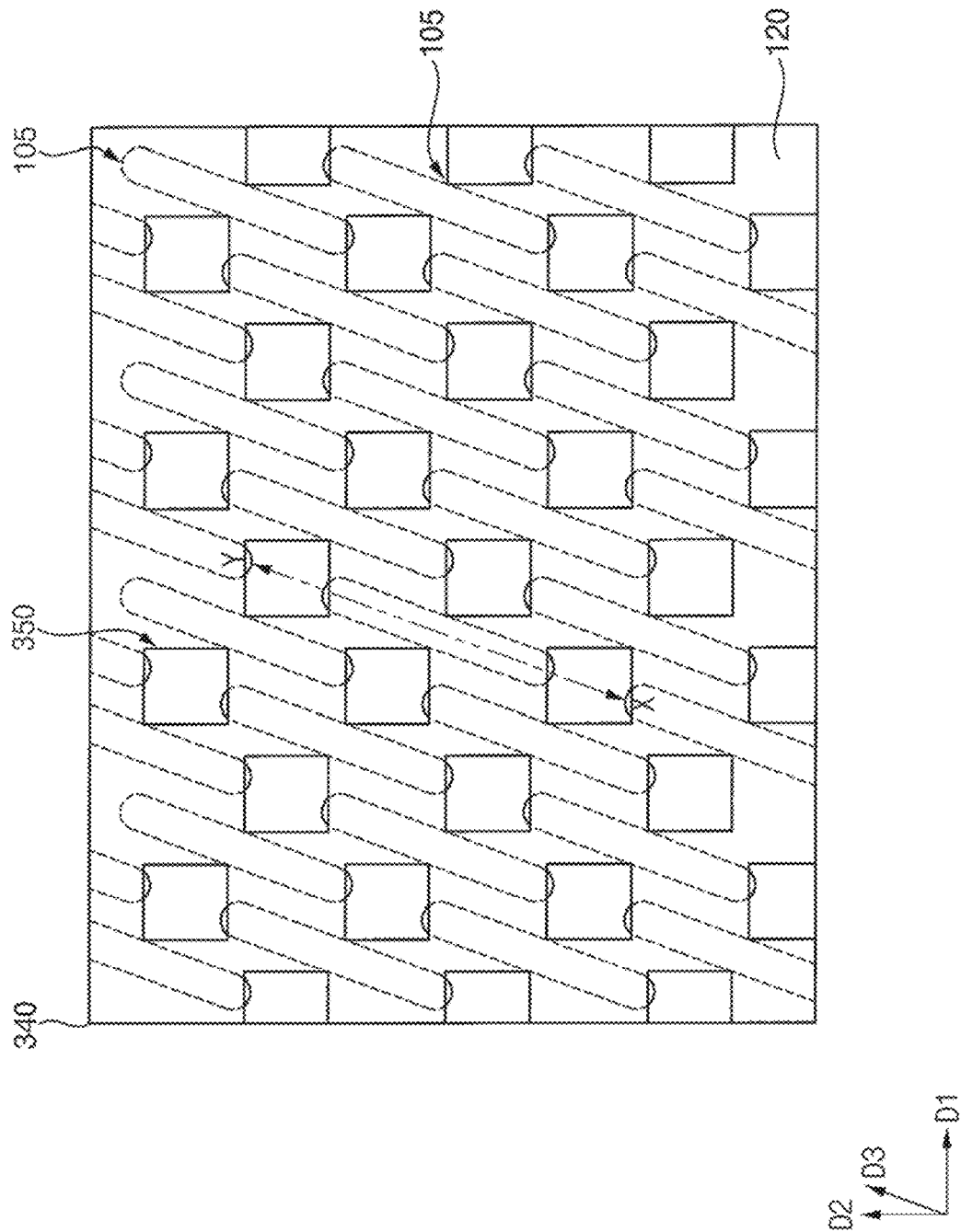
FIGS. 14 and 15 are plan views illustrating the method of forming the transistor structure in accordance with an example embodiment.
Figure 15:
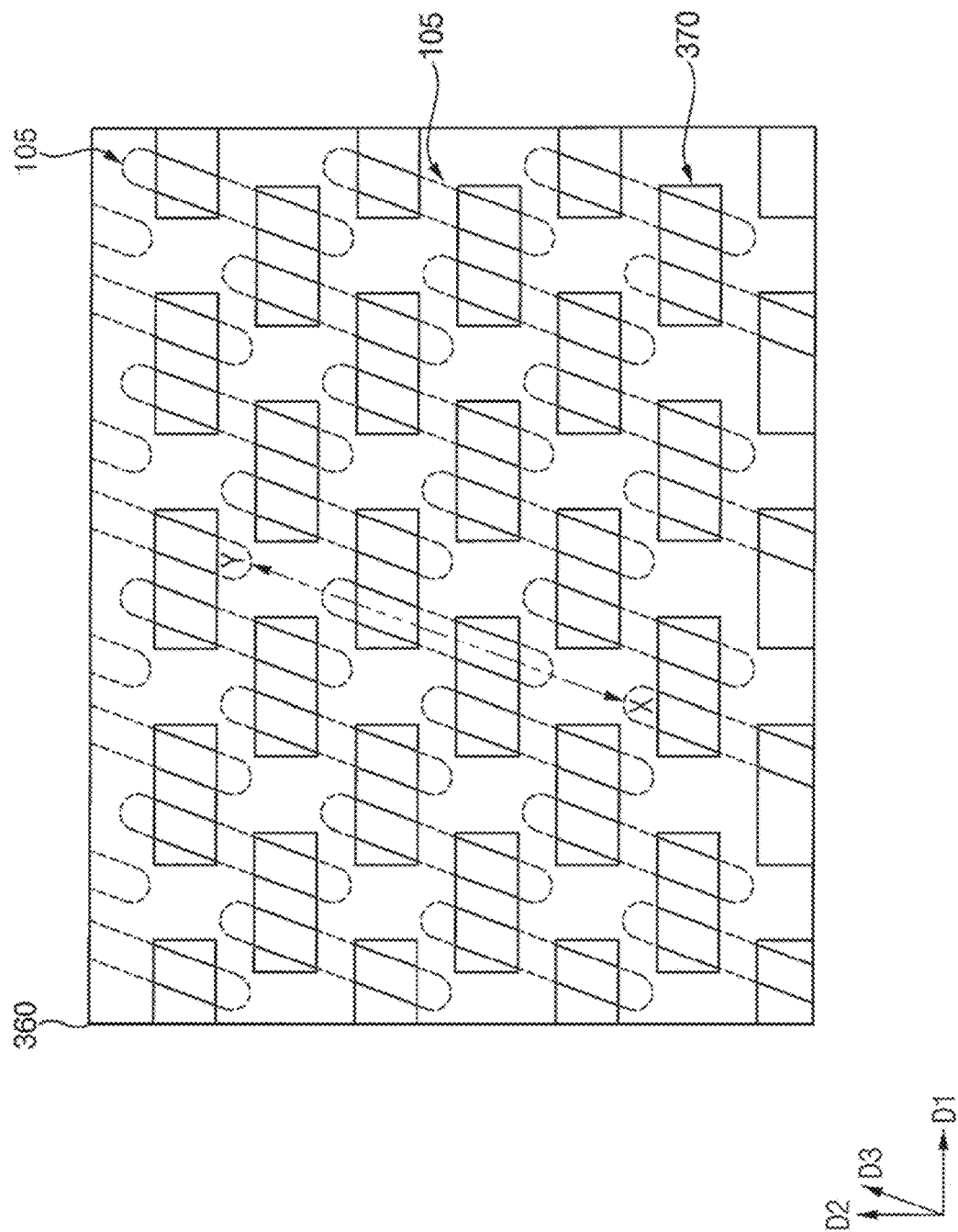

FIGS. 14 and 15 are plan views illustrating the method of forming the transistor structure in accordance with an example embodiment.

The first recess 110 may be formed on the substrate 100 to define the first active pattern 105, and the first isolation pattern 120 may be formed in the first recess 110.

Referring to FIG. 14, a first etching mask 340 may be formed on the first active pattern 105 and the first isolation pattern 120.

The first etching mask 340 may include a first opening 350 exposing opposite ends in the third direction D3 of each of the first active patterns 105 and a portion of the first isolation pattern between the active patterns 105.

The first active pattern 105 and the first isolation pattern 120 may be partially etched using the first etching mask 340, and thus the ninth recess 300 (refer to FIG. 13) may be formed at opposite sides of each of the first active patterns 105 and the portion of the first isolation pattern 120 therebetween.

The sixth oxide semiconductor pattern 310 may be formed on the bottom and the sidewall of the ninth recess 300 by, for example, an ALD process, and may be anisotropically etched so as to remain on the opposite sidewalls of each of the first active patterns 105. The isolation pattern 120 may be formed in a remaining portion of the ninth recess 300.

Referring to FIG. 15, a second etching mask 360 may be formed on the first active pattern 105, the first isolation pattern 120 and the sixth oxide semiconductor pattern 310.

The second etching mask 360 may include a second opening 370 exposing portions of the first active patterns 105 neighboring in the first direction D1 and a portion of the first isolation pattern 210 between the first active patterns 105.

The first active pattern 105 and the first isolation pattern 120 may be partially etched using the second etching mask 360 to form the eighth recess 320 (refer to FIG. 13) at portions of the first active patterns 105 and a portion of the first isolation pattern 120 therebetween.

The third isolation pattern 330 may be formed in the eighth recess 320, and the gate structure 210 may be formed through the first and third isolation patterns 120 and 330 and the first active pattern 105.

Upper portions of the first active pattern 105 and the third isolation pattern 330 adjacent to the gate structure 210 may be removed to form tenth recesses, and the first to third source/drain regions 222, 224 and 226 may be formed in the tenth recesses. In some example embodiments, n-type impurities may be doped into the upper portions of the first active pattern 105 to form the first to third source/drain regions 222, 224 and 226.

Figure 16:
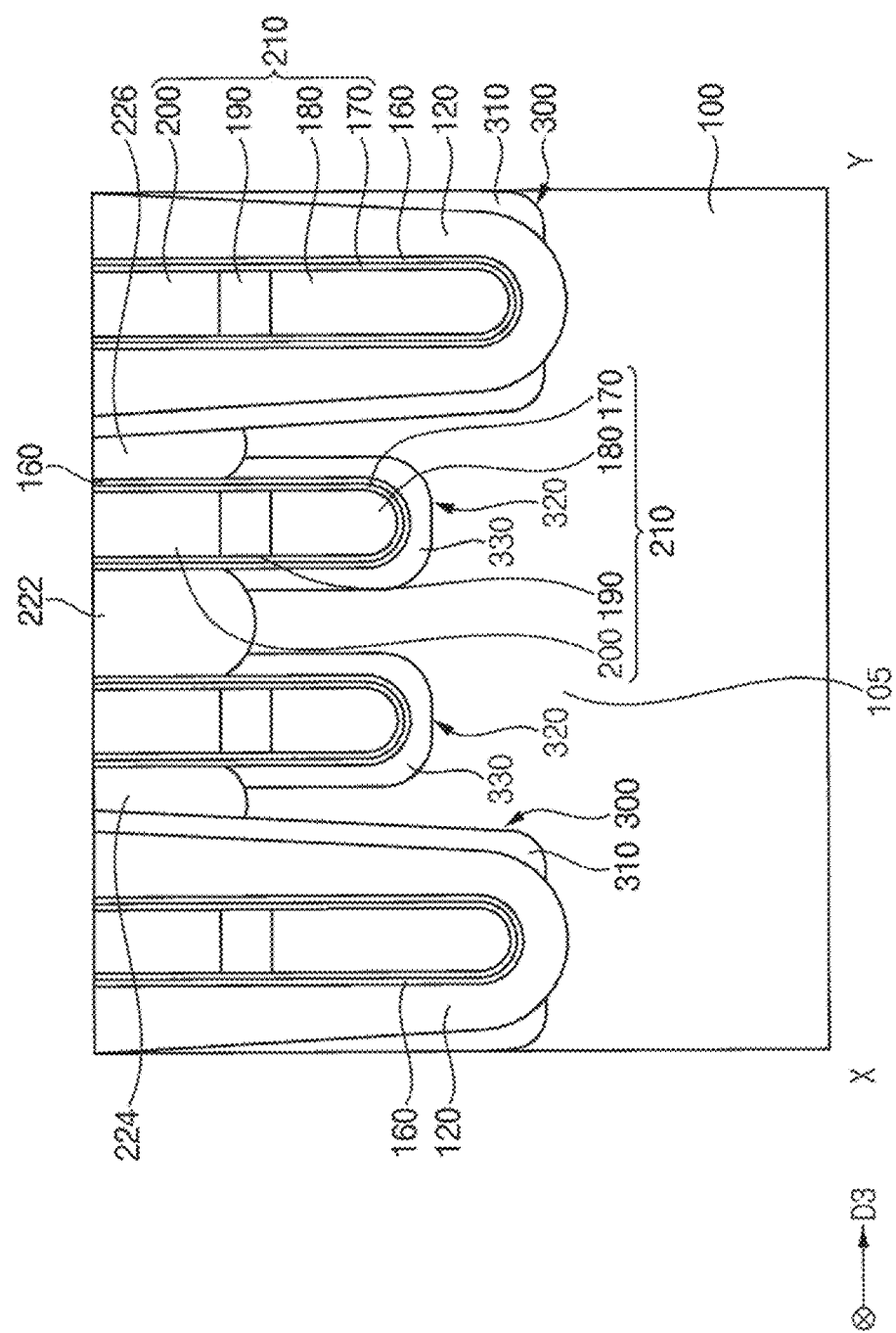
FIGS. 16 to 18 are cross-sectional views illustrating transistor structures in accordance with some example embodiments.
Figure 17:
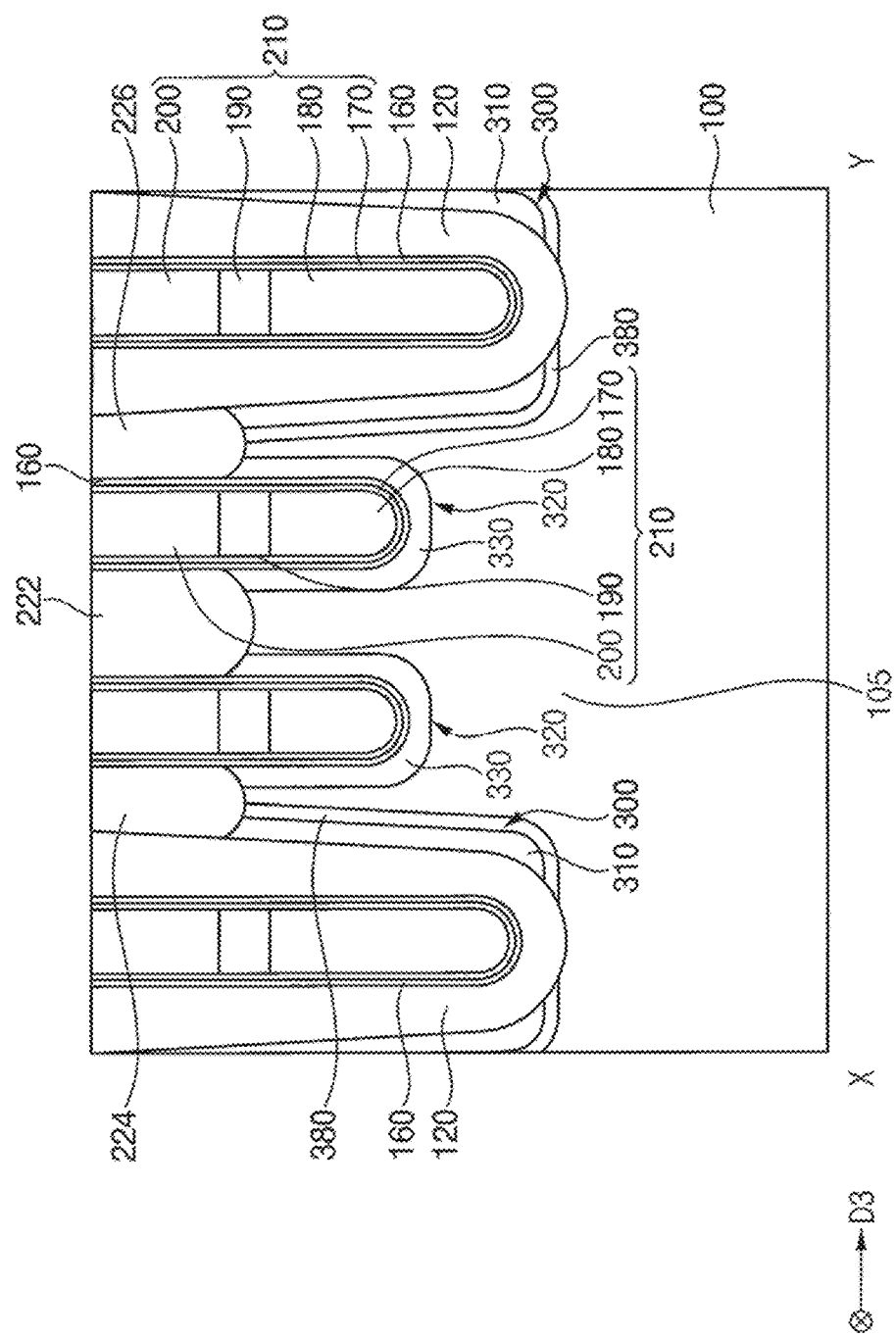
Figure 18:
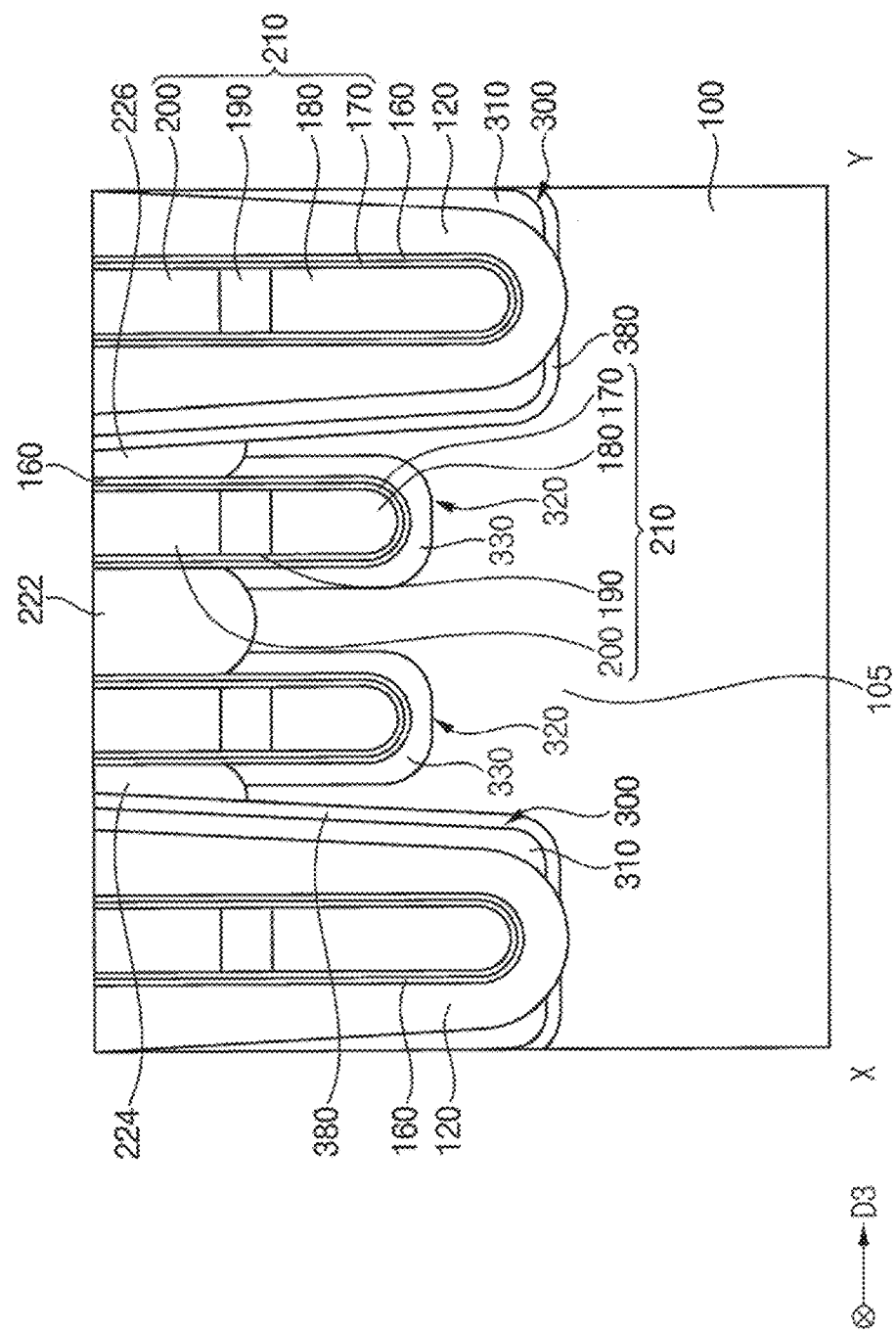

FIGS. 16 to 18 are cross-sectional views illustrating transistor structures in accordance with some example embodiments, and may correspond to FIG. 13.

The transistor structures may be substantially the same as or similar to that of FIG. 15, except for the shape of the sixth oxide semiconductor pattern 310 and further including an insulation pattern 380, and thus repeated explanations of the same elements are omitted herein.

Referring to FIG. 16, an upper surface of the sixth oxide semiconductor pattern 310 may be substantially coplanar with an upper surface of the first isolation pattern 120, and thus an upper sidewall of the sixth oxide semiconductor pattern 310 may contact the sidewalls of the second and third source/drain regions 224 and 226. In other words, the sixth oxide semiconductor pattern 310 may be provided on sidewalls of the second and third source/drain regions 224 and 226 at upper opposite ends in the third direction D3 of each of a plurality of first active patterns 105. The sixth oxide semiconductor pattern 310 may include Ga-rich IGZO. The sixth oxide semiconductor pattern 310 may directly contact the sidewall of each of the second and third source/drain regions 224 and 226.

Referring to FIG. 17, the insulation pattern 380 may be further formed on an outer sidewall of the sixth oxide semiconductor pattern 310 of FIG. 15, and may contact the sidewall of the first active pattern 105. The insulation pattern 380 may be between the sixth oxide semiconductor pattern 310 and the first active pattern 105. The insulation pattern 380 may directly contact a lower surface of each of the second and third source/drain regions 224 and 226.

Referring to FIG. 18, the insulation pattern 380 may be further formed on an outer sidewall of the sixth oxide semiconductor pattern 310 of FIG. 16, and may contact the sidewalls of the first active pattern 105 and the second and third oxide semiconductor patterns 224 and 226.

The insulation pattern 380 may include oxide (e.g., silicon oxide), and may serve as a buffer between the sixth oxide semiconductor pattern 310 including, for example, Ga-rich IGZO and the first active pattern 105 including, for example, silicon.

FIGS. 19 to 35 are plan views and cross-sectional views illustrating a method of manufacturing a semiconductor device in accordance with an example embodiment. FIGS. 19, 21, 24, 28 and 32 are the plan views, and each of FIGS. 20, 22-23, 25-27, 29-31 and 33-35 includes cross-sections taken along lines A-A' and B-B' of a corresponding plan view.

This method of manufacturing the semiconductor device is an application of the method of forming the transistor structures illustrated with reference to FIGS. 1 and 2 or FIGS. 9 to 18 to method of manufacturing a DRAM device.

Hereinafter, a method of manufacturing a DRAM device using the method of forming the transistor structure of FIGS. 1 and 2, and thus repeated explanations are omitted herein.

Figure 19:
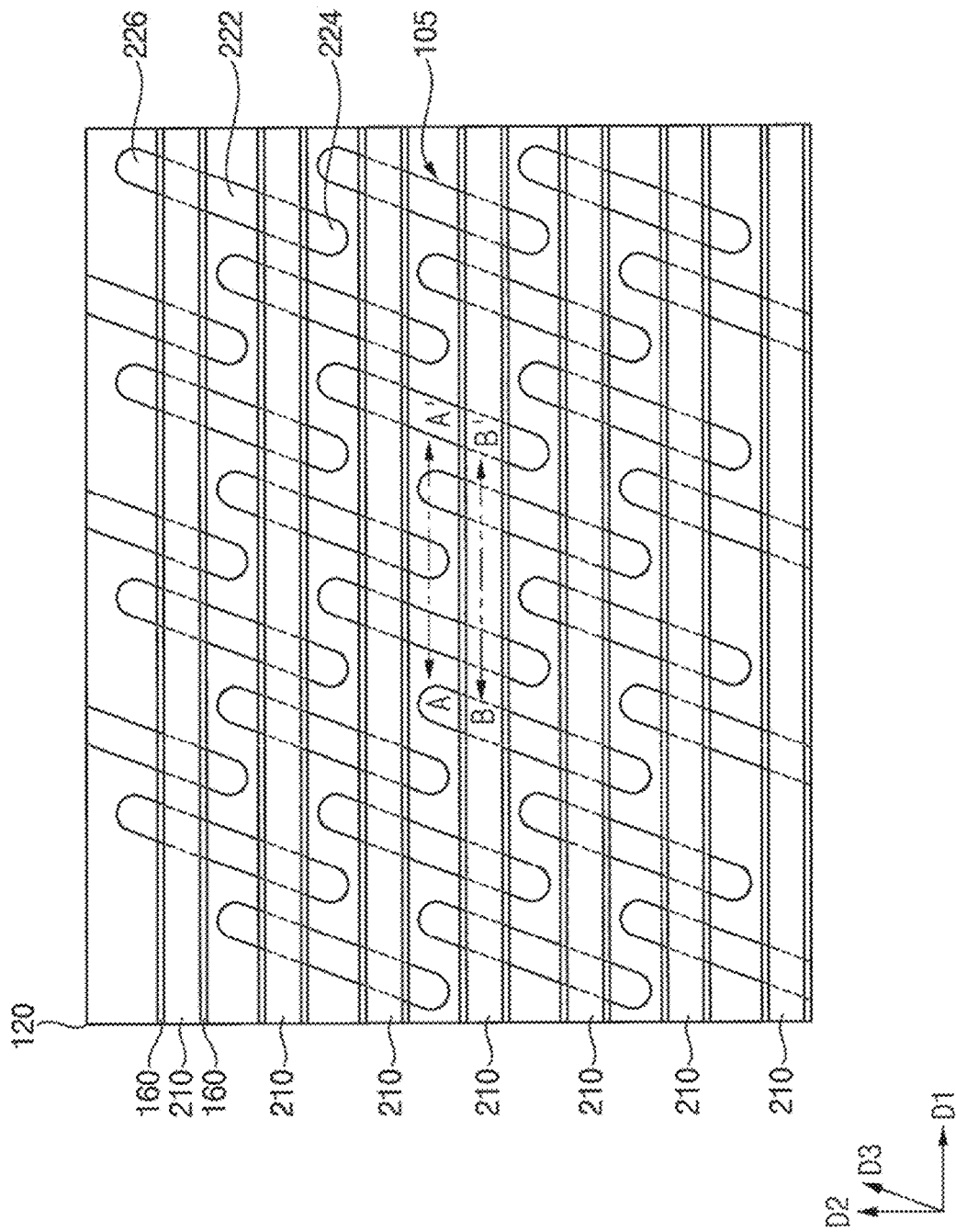

Referring to FIGS. 19 and 20, the transistor structure of FIGS. 1 and 2 may be formed. Thus, the first active pattern 105, the first and second isolation patterns 120 and 140, the gate structure 210, the first oxide semiconductor pattern 160, and the first to third source/drain regions 222, 224 and 226 may be formed on the substrate 100.

Figure 21:
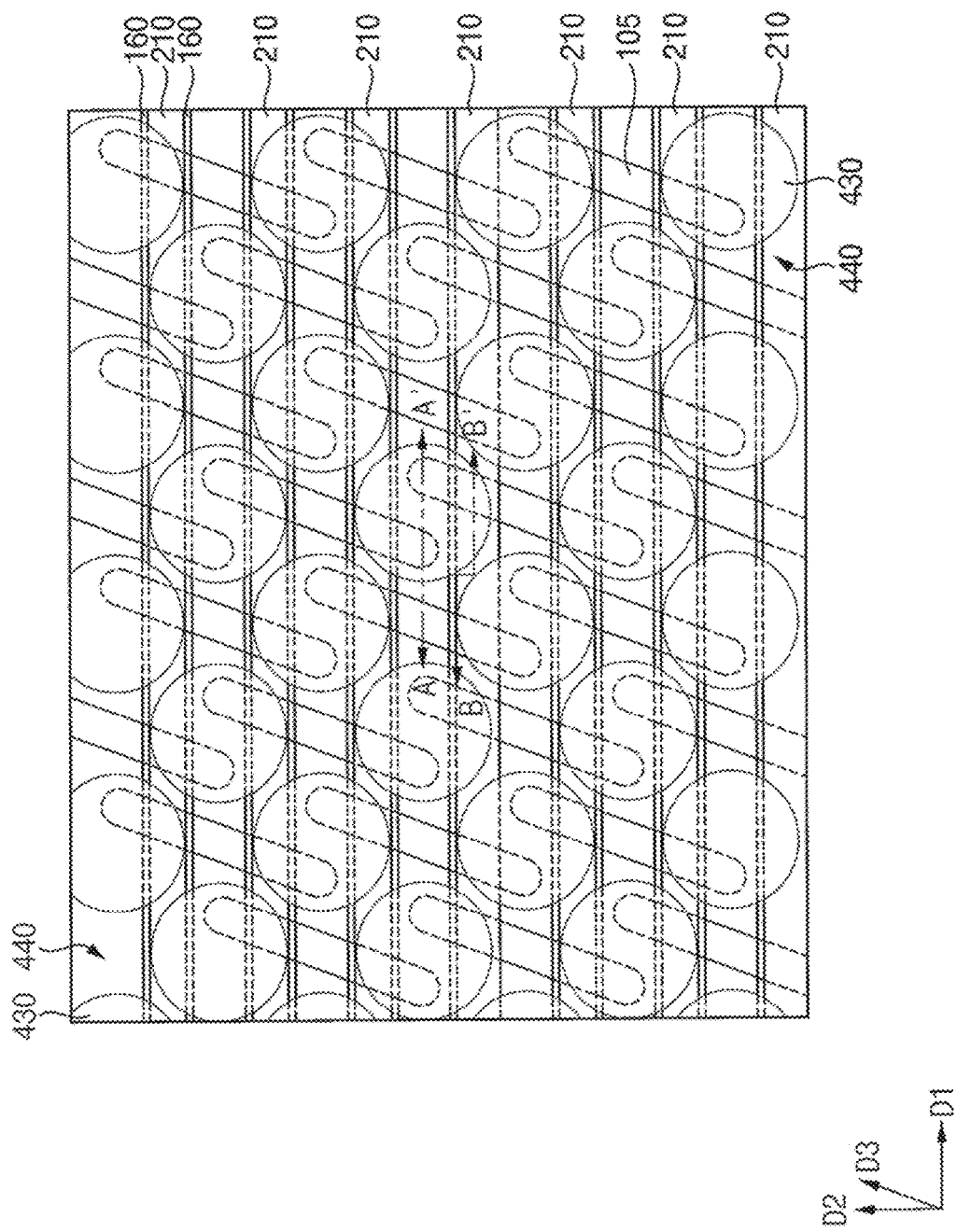
Figure 22:
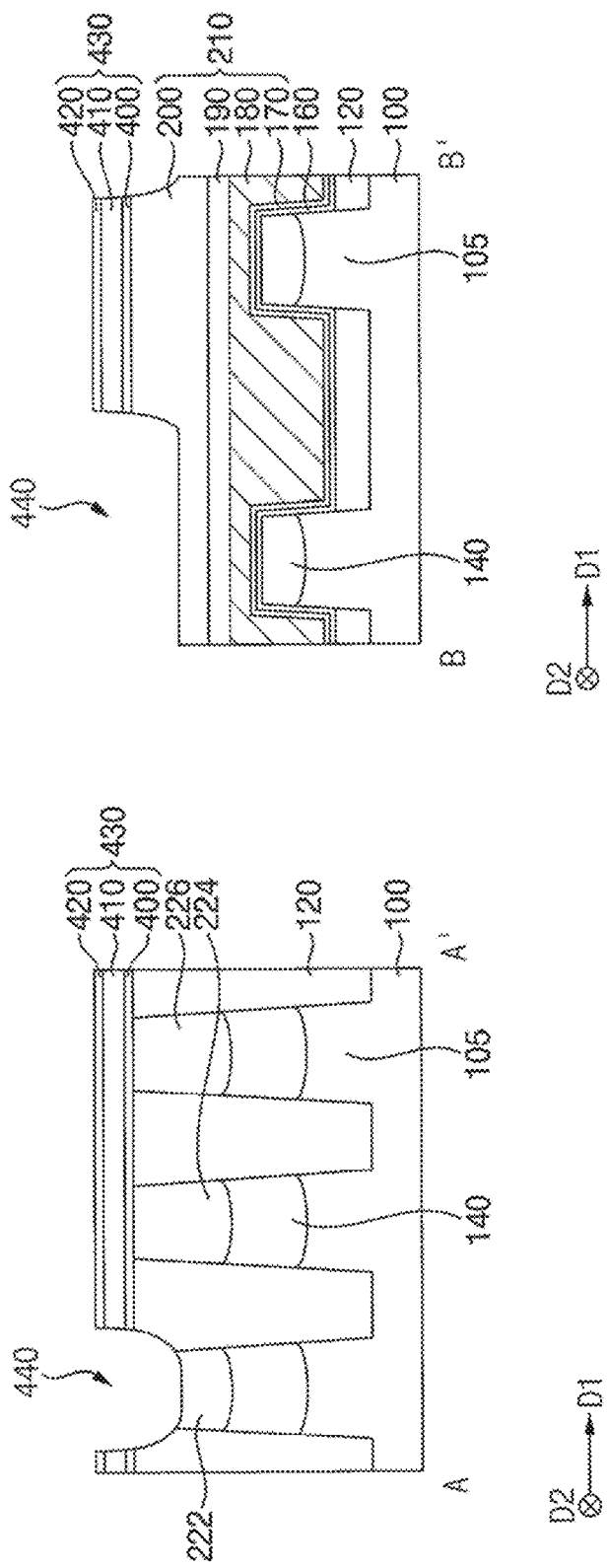

Referring to FIGS. 21 and 22, an insulation layer structure 430 may be formed on the first active pattern 105, the first and second isolation patterns 120 and 140, the first oxide semiconductor pattern 160 and the gate structure 210. The insulation layer structure 430 may include first, second and third insulation layers 400, 410 and 420 sequentially stacked. The first and third insulation layers 400 and 420 may include, for example, oxide such as silicon oxide, and the second insulation layer 410 may include, for example, nitride (e.g., silicon nitride).

The insulation layer structure 430 may be patterned, and the first source/drain region 222, the first isolation pattern 120, the gate mask 200 included in the gate structure 210 and the first oxide semiconductor pattern 160 may be partially etched using the patterned insulation layer structure 430 as an etching mask to form a third opening 440. In some example embodiments, the patterned insulation layer structure 430 may have a shape of a circle or an ellipse in a plan view, and a plurality of insulation layer structures 430 may be spaced apart from each other in the first and second directions D1 and D2. Each of the insulation layer structures 430 may overlap end portions in the third direction D3 of the neighboring second and third source/drain regions 224 and 226 in a vertical direction substantially perpendicular to an upper surface of the substrate 300.

Referring to FIG. 23, a first conductive layer 450, a first barrier layer 460, a second conductive layer 470 and a first mask layer 480 may be sequentially stacked on the insulation layer structure 430, and the first source/drain region 222, the first isolation pattern 120, the gate structure 210 and the first oxide semiconductor pattern 160 exposed by the third opening 440, and the first conductive layer 450, the first barrier layer 460 and the second conductive layer 470 may form a conductive layer structure. The first conductive layer 450 may fill the third opening 440.

The first conductive layer 450 may include, for example, doped polysilicon, the first barrier layer 460 may include, for example, metal silicon nitride (e.g., titanium silicon nitride), the second conductive layer 470 may include, for example, metal (e.g., tungsten), and the first mask layer 480 may include, for example, nitride (e.g., silicon nitride).

Figure 24:
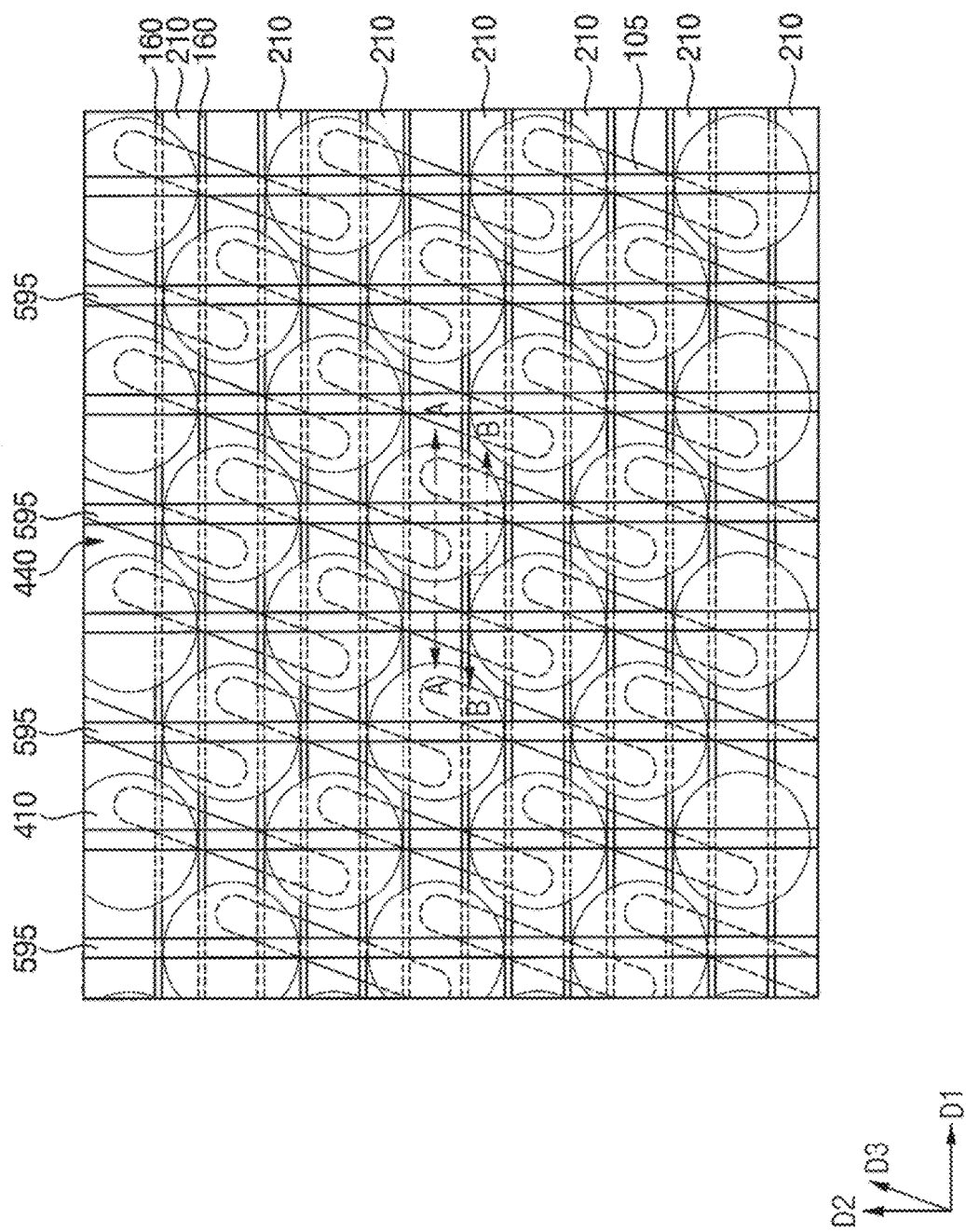
Figure 25:
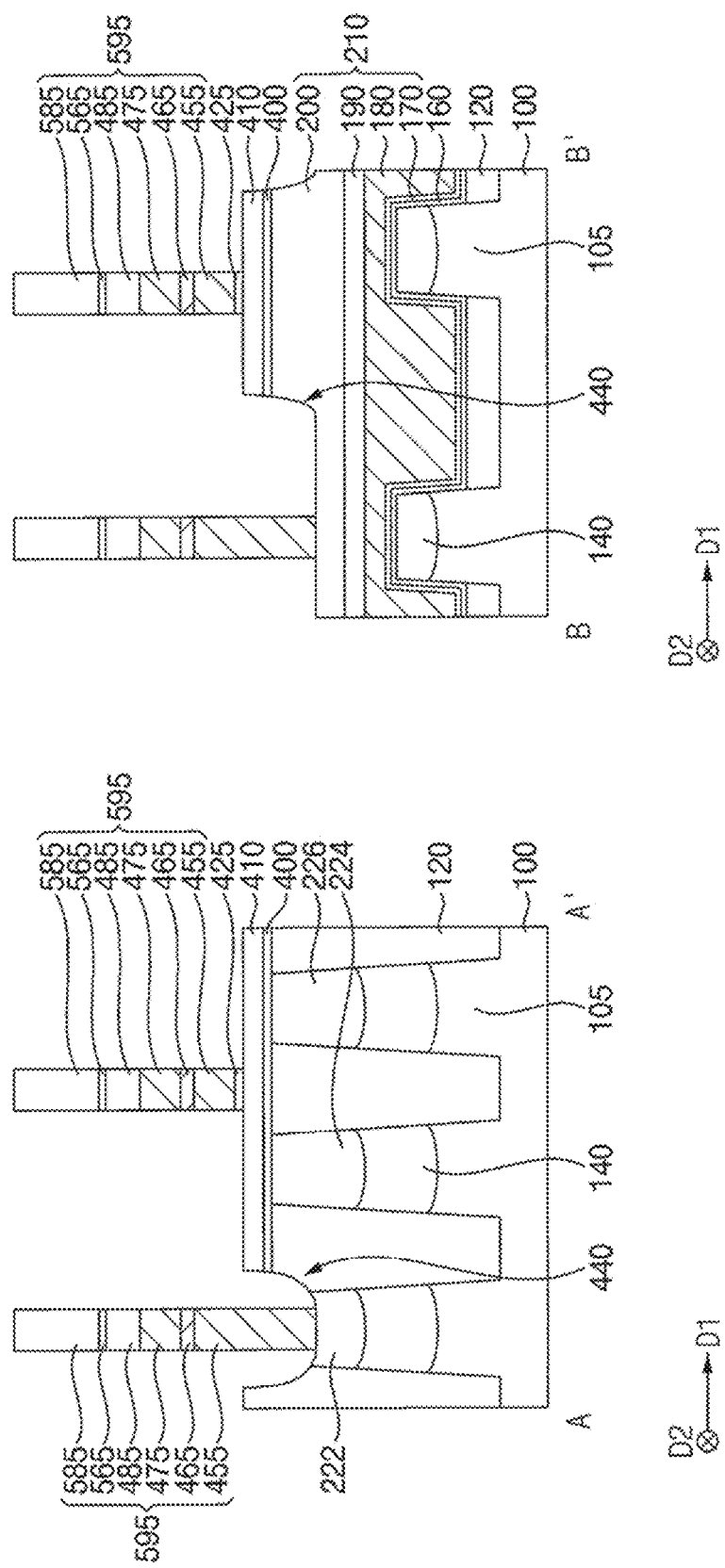

Referring to FIGS. 24 and 25, a first etch stop layer and a first capping layer may be sequentially formed on the conductive layer structure, the first capping layer may be etched to form a first capping pattern 585, and the first etch stop layer, the first mask layer 480, the second conductive layer 470, the first barrier layer 460 and the first conductive layer 450 may be sequentially etched using the first capping pattern 585 as an etching mask.

In some example embodiments, the first capping pattern 585 may extend in the second direction D2, and a plurality of first capping patterns 585 may be spaced apart from each other in the first direction D1.

By the etching process, a first conductive pattern 455, a first barrier pattern 465, a second conductive pattern 475, a first mask 485, a first etch stop pattern 565 and the first capping pattern 585 may be sequentially stacked on the third opening 440, and a third insulation pattern 425, the first conductive pattern 455, the first barrier pattern 465, the second conductive pattern 475, the first mask 485, the first etch stop pattern 565 and the first capping pattern 585 may be sequentially stacked on the second insulation layer 410 of the insulation layer structure 430 at an outside of the third opening 440.

Hereinafter, the first conductive pattern 455, the first barrier pattern 465, the second conductive pattern 475, the first mask 485, the first etch stop pattern 565 and the first capping pattern 585 sequentially stacked may be referred to as a bit line structure 595. The bit line structure 595 may include a conductive structure including the first conductive pattern 455, the first barrier pattern 465 and the second conductive pattern 475 sequentially stacked, and an insulation structure on the conductive structure and including the first mask 485, the first etch stop pattern 565 and the first capping pattern 585 sequentially stacked on the conductive structure. In some example embodiments, the bit line structure 595 may extend in the second direction D2 on the substrate 100, and a plurality of bit line structures 595 may be spaced apart from each other in the first direction D1.

Figure 26:
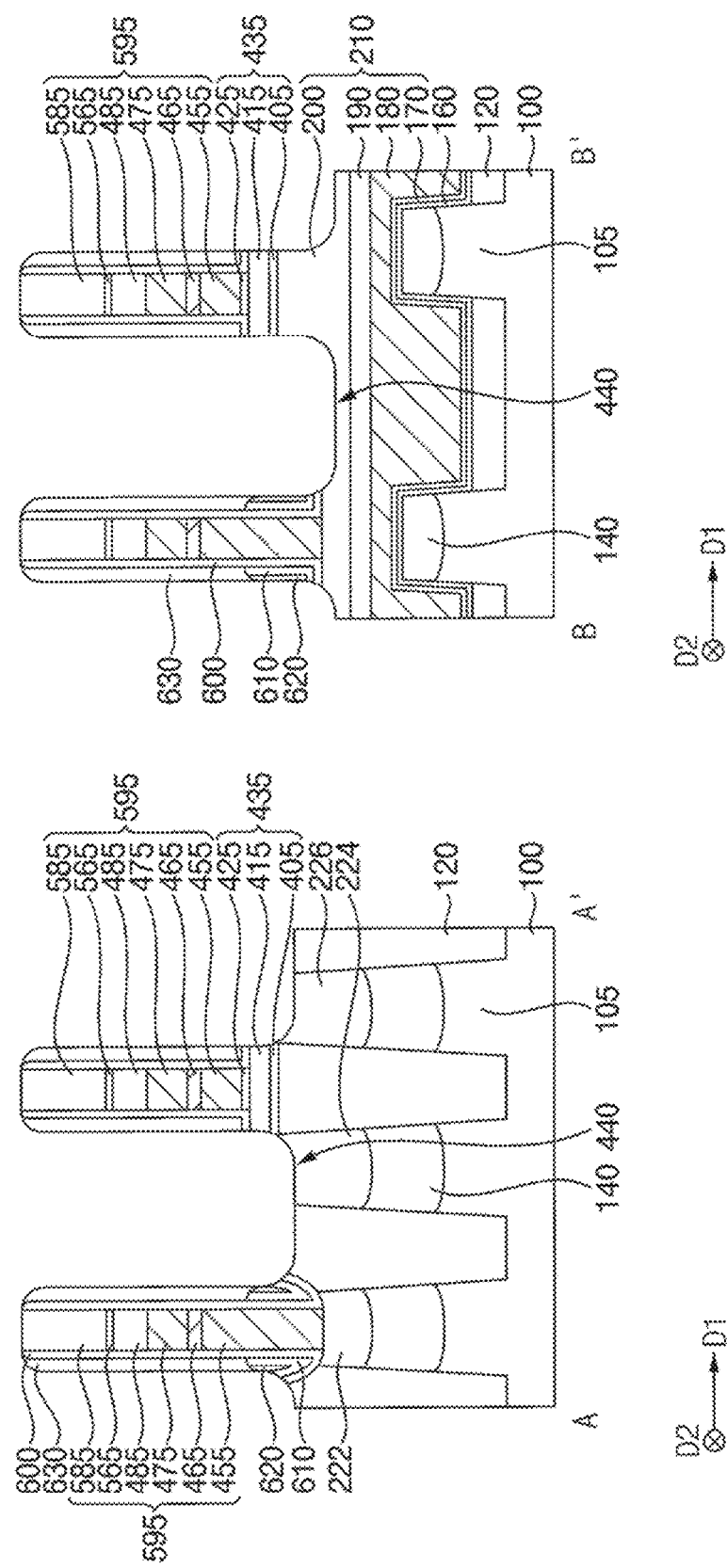

Referring to FIG. 26, a first spacer layer may be formed on the substrate 300 having the bit line structure 595 thereon, and fourth and fifth insulation layers may be sequentially formed on the first spacer layer.

The first spacer layer may also cover a sidewall of the third insulation pattern 425 under a portion of the bit line structure 595 on the second insulation layer 410, and the fifth insulation layer may fill a remaining portion of the first opening 440.

The first spacer layer may include, for example, nitride (e.g., silicon nitride), the fourth insulation layer may include, for example, oxide such as silicon oxide, and the fifth insulation layer may include, for example, nitride (e.g., silicon nitride).

The fourth and fifth insulation layers may be etched by an etching process. In some example embodiments, the etching process may be performed by a wet etching process using phosphoric acid, SC1 and hydrofluoric acid as an etching solution, and other portions of the fourth and fifth insulation layers except for portions of the fourth and fifth insulation layers in the third opening 440 may be removed. Thus, most portion of a surface of the first spacer layer, that is, other portions of the first spacer layer except for the portion thereof in the third opening 440 may be exposed, and the portions of the fourth and fifth insulation layers remaining in the third opening 440 may form fourth and fifth insulation patterns 610 and 620, respectively.

A second spacer layer may be formed on the exposed surface of the first spacer layer and the fourth and fifth insulation patterns 610 and 620 in the third opening 440, and may be anisotropically etched to form a second spacer 630 on the surface of the first spacer layer and the fourth and fifth insulation patterns 610 and 620 to cover a sidewall of the bit line structure 595. The second spacer layer may include, for example, a oxide (e.g., silicon oxide).

A dry etching process may be performed using the first capping pattern 585 and the second spacer 630 as an etching mask to form a fourth opening 640 exposing upper surfaces of the second and third source/drain regions 224 and 226, and upper surfaces of the first isolation pattern 120 and the gate mask 200 may also be exposed by the fourth opening 640.

By the dry etching process, a portion of the first spacer layer on the upper surfaces of the first capping pattern 585 and the second insulation layer 410 may be removed, and thus a first spacer 600 may be formed to cover the sidewall of the bit line structure 595. Additionally, during the dry etching process, the first and second insulation layers 400 and 410 may be partially removed, and first and second insulation patterns 405 and 415 may remain under the bit line structure 595. The first to third insulation patterns 405, 415 and 425 sequentially stacked under the bit line structure 595 may form a first insulation pattern structure.

Figure 27:
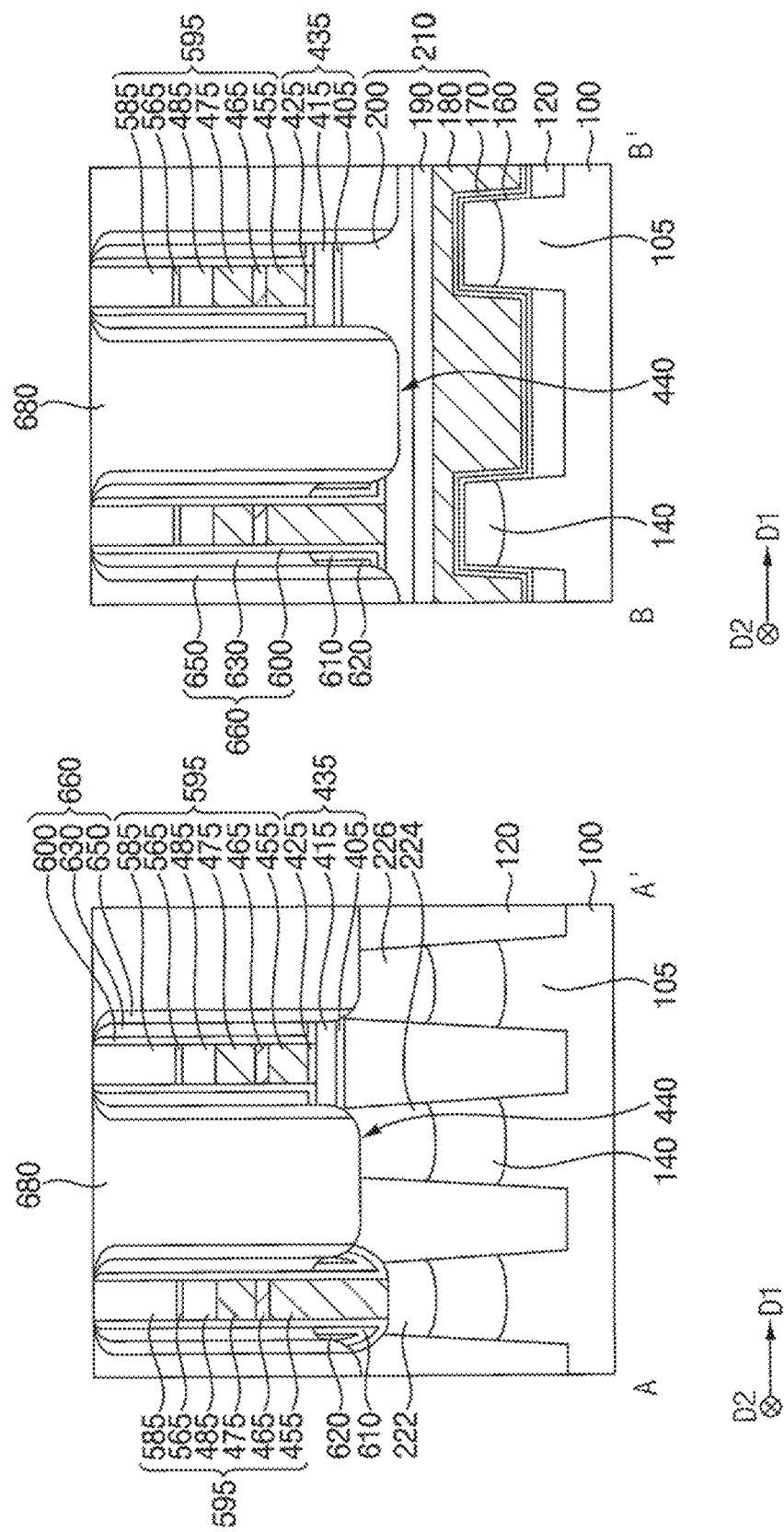

Referring to FIG. 27, a third spacer layer may be formed on the upper surface of the first capping pattern 585, an outer sidewall of the second spacer 630, portions of the upper surfaces of the fourth and fifth insulation patterns 610 and 620, and upper surfaces of the first source/drain region 222, the first isolation pattern 120, the gate structure 210 and the first oxide semiconductor pattern 160 exposed by the fourth opening 640, and may be anisotropically etched to form a third spacer 650 covering the sidewall of the bit line structure 595. The third spacer layer may include, for example, nitride (e.g., silicon nitride).

The first spacer 600, the second spacer 630 and the third spacer 650 sequentially stacked on the sidewall of the bit line structure 595 in a horizontal direction substantially parallel to the upper surface of the substrate 300 may be referred to as a preliminary spacer structure 660.

A first sacrificial layer may be formed on the substrate 100 to fill the fourth opening 640, and may be planarized until an upper surface of the first capping pattern 585 is exposed to form a first sacrificial pattern 680 in the fourth opening 640.

In some example embodiments, the first sacrificial pattern 680 may extend in the second direction D2, and a plurality of first sacrificial patterns 680 may be spaced apart from each other in the first direction D1. The first sacrificial pattern 680 may include oxide (e.g., silicon oxide).

Figure 28:
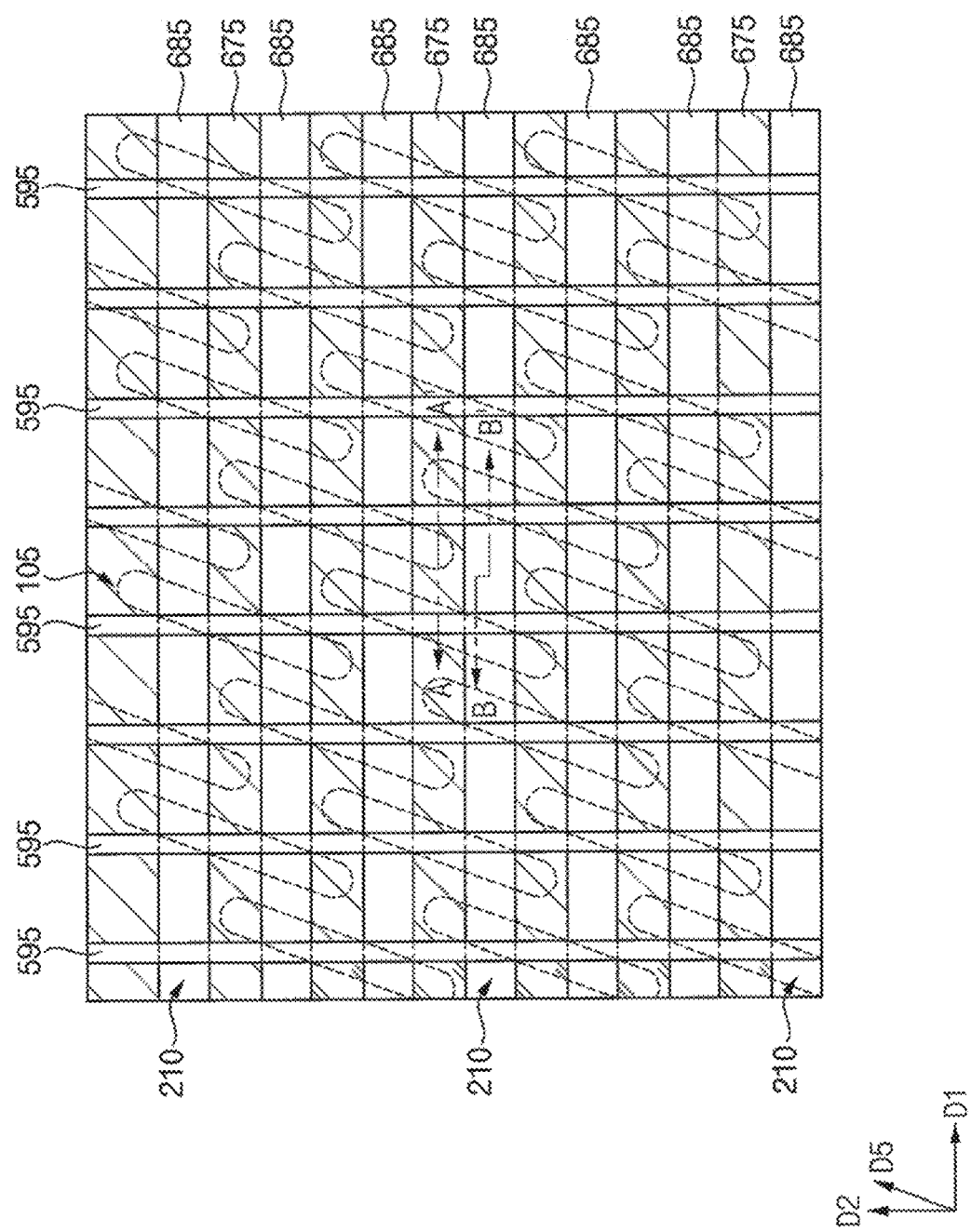
Figure 29:
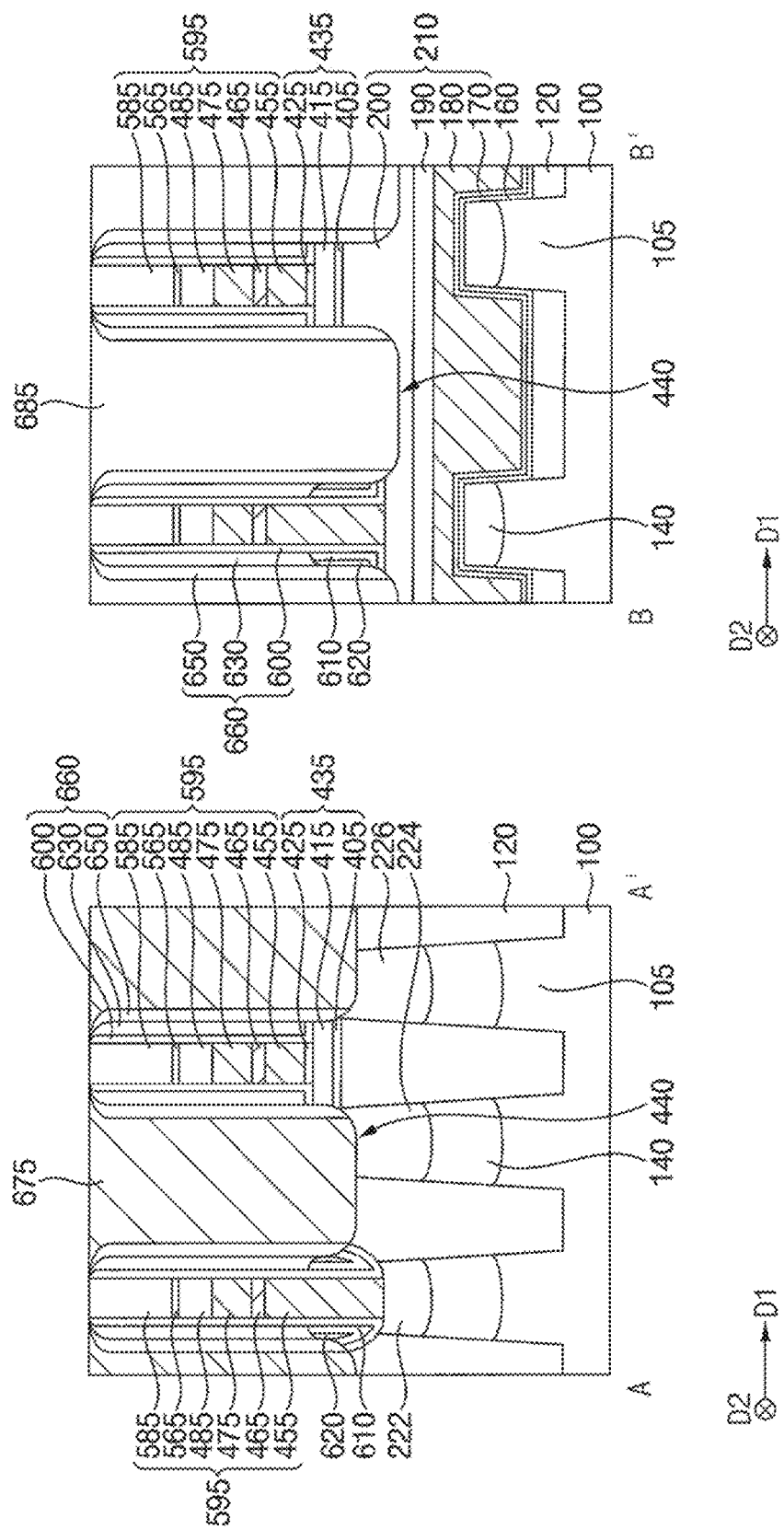

Referring to FIGS. 28 and 29, a second mask having a plurality of fifth openings spaced apart from each other in the second direction D2, each of which may extend in the first direction D1, may be formed on the first capping pattern 585, the first sacrificial pattern 680 and the preliminary spacer structure 660, and the first sacrificial pattern 680 may be etched using the second mask as an etching mask.

In some example embodiments, each of the fifth openings may overlap an area between the gate structures 210 in the vertical direction. By the etching process, a sixth opening exposing upper surfaces of the first source/drain region 222 and the first isolation pattern 120 may be formed between the bit line structures 595.

After removing the second mask, a lower contact plug layer may be formed to fill the sixth opening, and an upper portion of the lower contact plug layer may be planarized until upper surfaces of the first capping pattern 585, the first sacrificial pattern 680, and the preliminary spacer structure 660 are exposed. Thus, the lower contact plug layer may be transformed into a plurality of lower contact plugs 675 spaced apart from each other in the second direction D2 between the bit line structures 595. Further, the first sacrificial pattern 680 extending in the second direction D2 between the bit line structures 595 may be divided a plurality of parts spaced apart from each other in the second direction D2 by the lower contact plugs 675.

The lower contact plug 675 may include, for example, doped polysilicon.

The first sacrificial pattern 680 may be removed to form a seventh opening, and a second capping pattern 685 may be formed to fill the seventh opening. In some example embodiments, the second capping pattern 685 may overlap the gate structure 210 in the vertical direction. The second capping pattern 685 may include nitride (e.g., silicon nitride).

Figure 30:
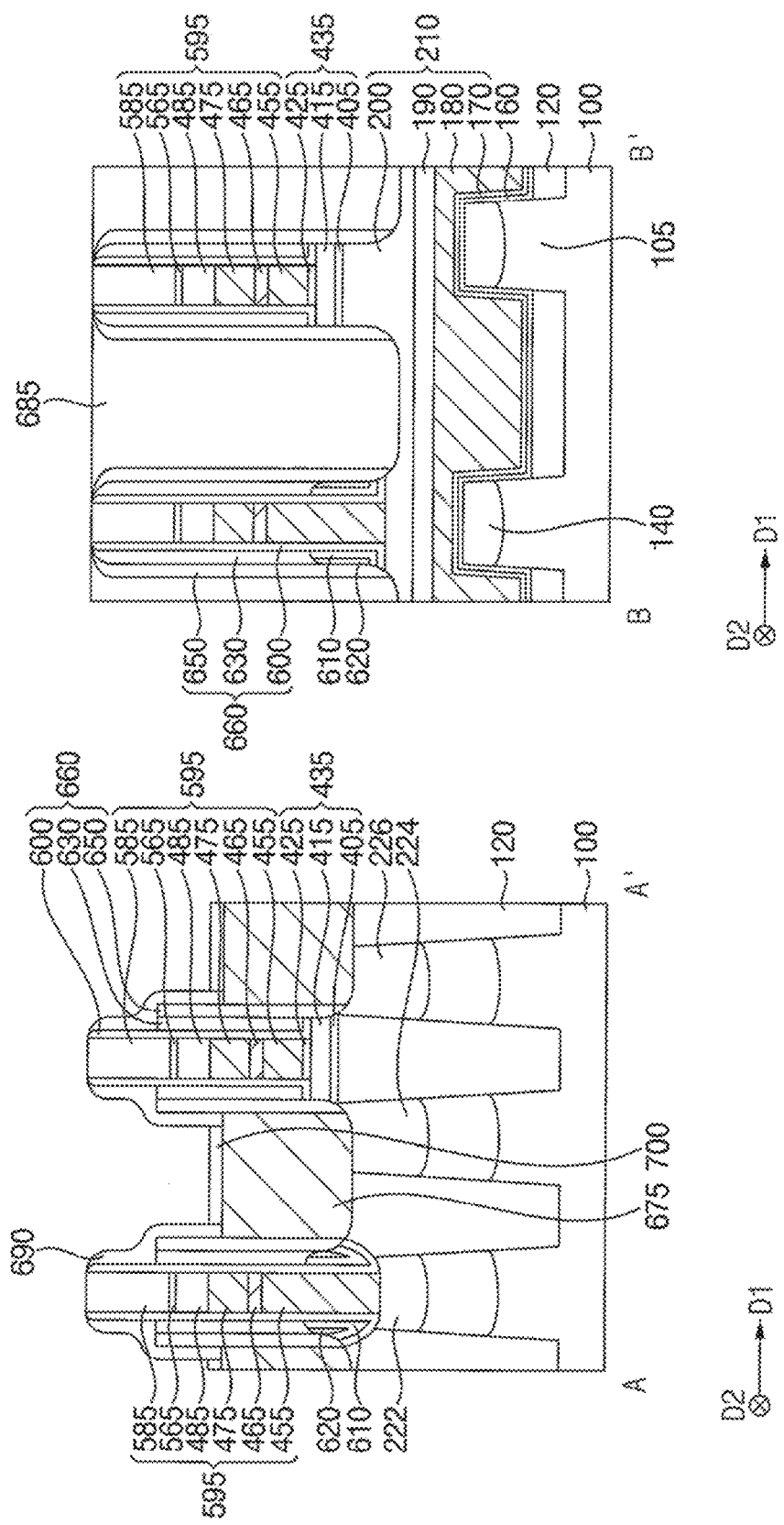
Figure 31:
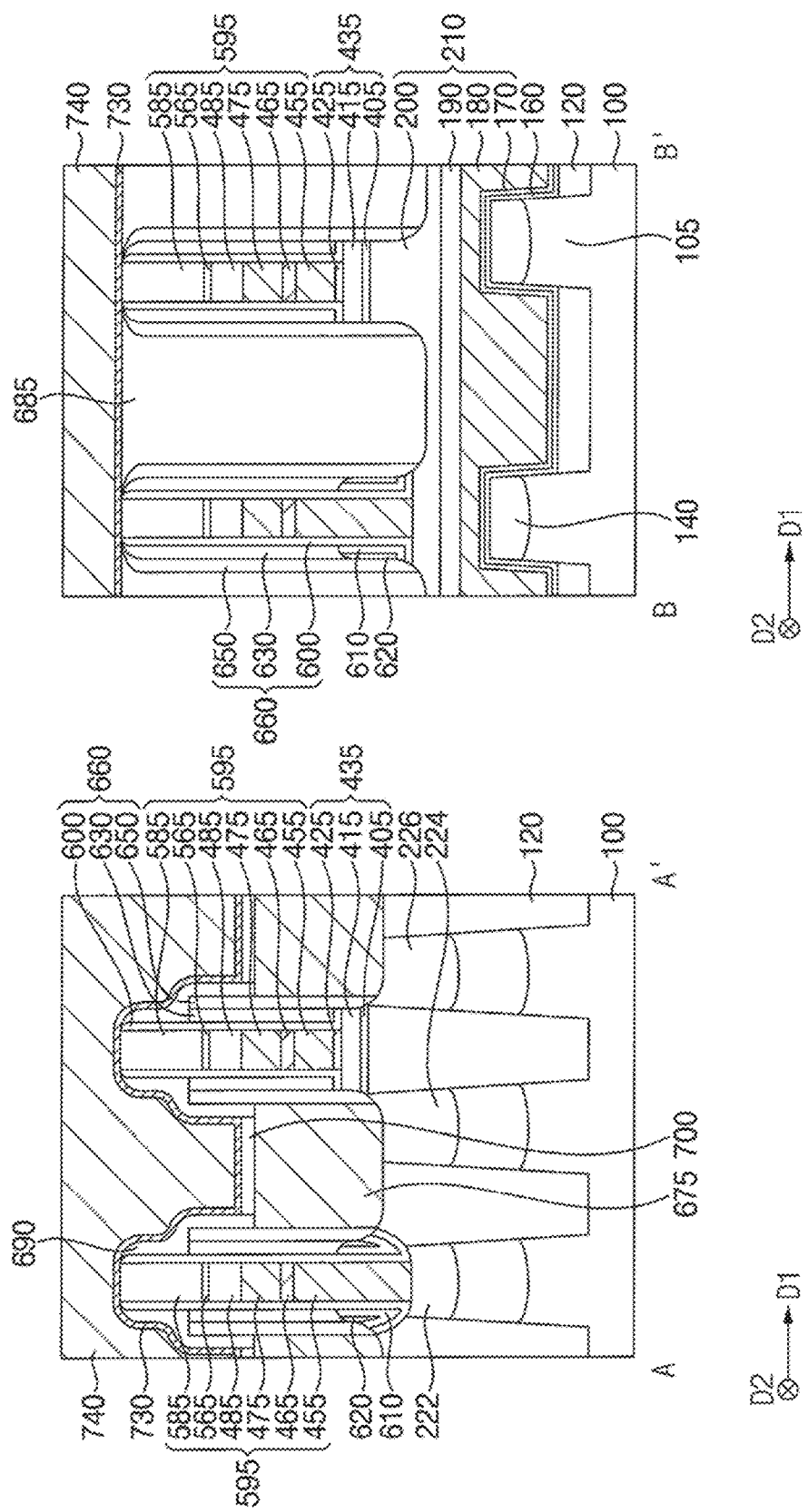

Referring to FIG. 30, an upper portion of the lower contact plug 675 may be removed to expose an upper portion of the preliminary spacer structure 660 on the sidewall of the bit line structure 595, and upper portions of the second and third spacers 630 and 650 of the exposed preliminary spacer structure 660 may be removed.

An upper portion of the lower contact plug 675 may be further removed. Thus, an upper surface of the lower contact plug 675 may be lower than uppermost surfaces of the second and third spacers 630 and 650.

A fourth spacer layer may be formed on the bit line structure 595, the preliminary spacer structure 660, the second capping pattern 685 and the lower contact plug 675, and may be anisotropically etched to form a fourth spacer 690 covering an upper portion of the preliminary spacer structure 660 on each of opposite sidewalls in the first direction D1 of the bit line structure 595, so that an upper surface of the lower contact plug 675 may be exposed.

A metal silicide pattern 700 may be formed on the exposed upper surface of the lower contact plug 675. In some example embodiments, the metal silicide pattern 700 may be formed by forming a first metal layer on the first and second capping patterns 585 and 685, the fourth spacer 690 and the lower contact plug 675, performing a heat treatment on the first metal layer to perform a silicidation process in which the first metal layer including metal and the lower contact plug 675 including silicon are reacted with each other, and removing an unreacted portion of the first metal layer. The metal silicide pattern 700 may include, for example, cobalt silicide, nickel silicide, or titanium silicide.

Referring to FIG. 13, a second barrier layer 730 may be formed on the first and second capping patterns 585 and 685, the fourth spacer 690 and the metal silicide pattern 700, and a second metal layer 740 may be formed on the second barrier layer 730 to fill a space between the bit line structures 595.

The second barrier layer 730 may include, for example, metal nitride (e.g., titanium nitride), and the second metal layer 740 may include, for example, metal (e.g., tungsten).

A planarization process may be further performed on the second metal layer 740. The planarization process may include a chemical mechanical polishing (CMP) process and/or an etch back process.

Figure 32:
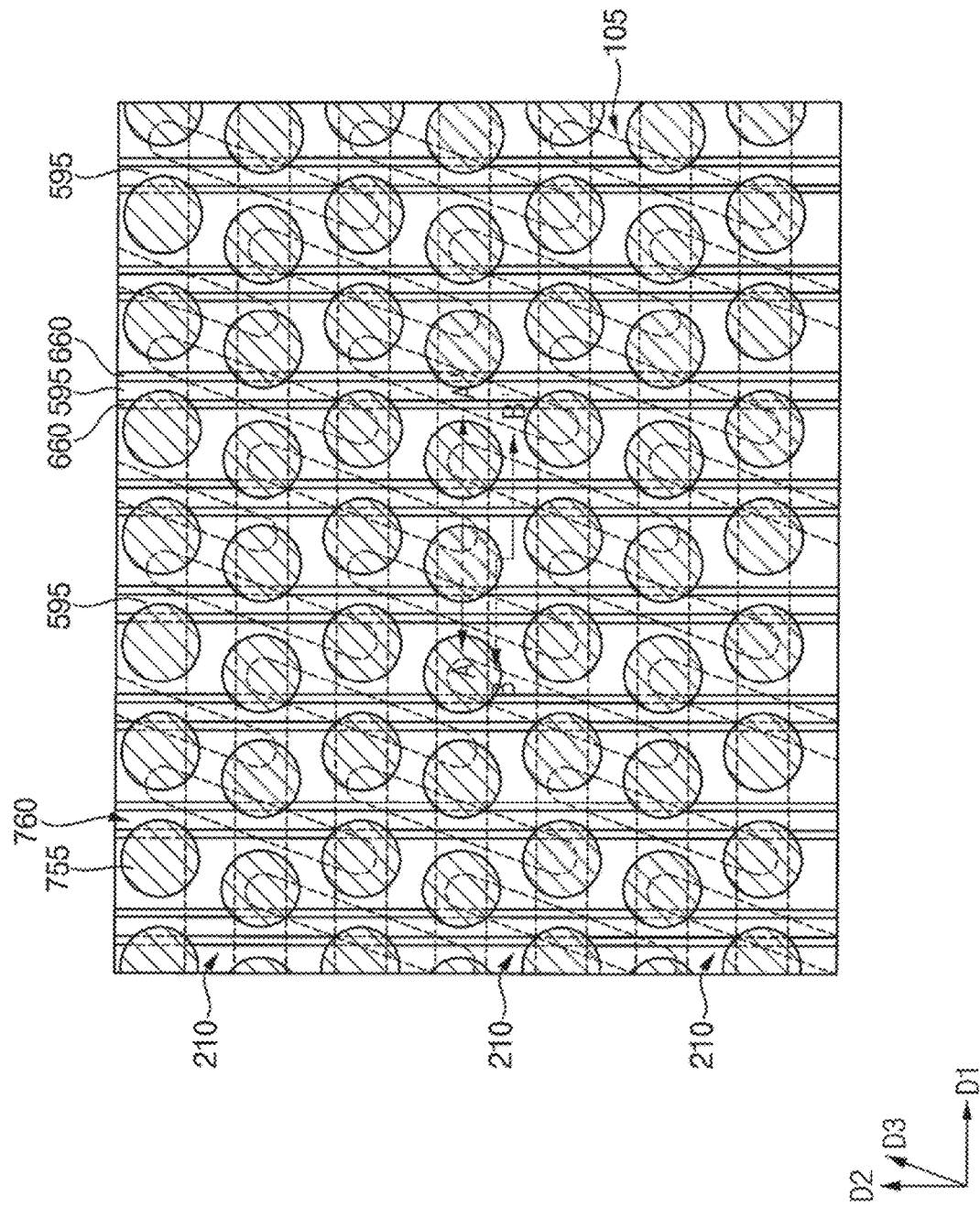
Figure 33:
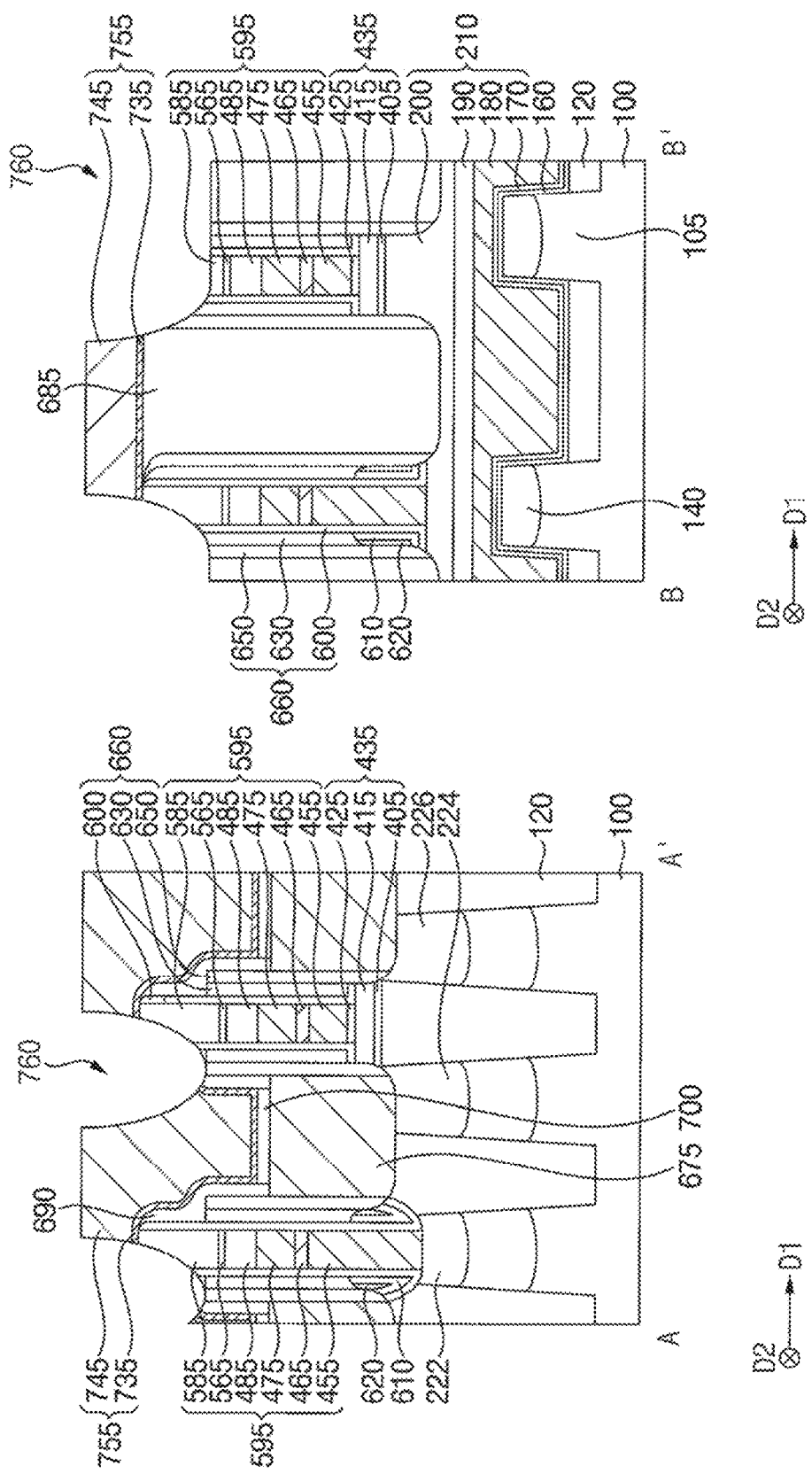

Referring to FIGS. 32 and 33, the second metal layer 740 and the second barrier layer 730 may be patterned to form an upper contact plug 755, and an eighth opening 760 may be formed between the upper contact plugs 755.

The eighth opening 760 may be formed by partially removing the first and second capping patterns 585 and 685, the fourth spacer 690 and the fourth spacer 690 as well as the second metal layer 740 and the second barrier layer 730.

The upper contact plug 755 may include a second metal pattern 745 and a second barrier pattern 735 covering a lower surface of the second metal pattern 745. In some example embodiments, the upper contact plug 755 may have a shape of a circle, an ellipse, a polygon, or a polygon with a rounded corner, and a plurality of upper contact plugs 755 may be arranged, for example, in a honeycomb pattern, in a plan view.

The lower contact plug 675, the metal silicide pattern 700 and the upper contact plug 755 sequentially stacked on the substrate 100 may form a contact plug structure.

Figure 34:
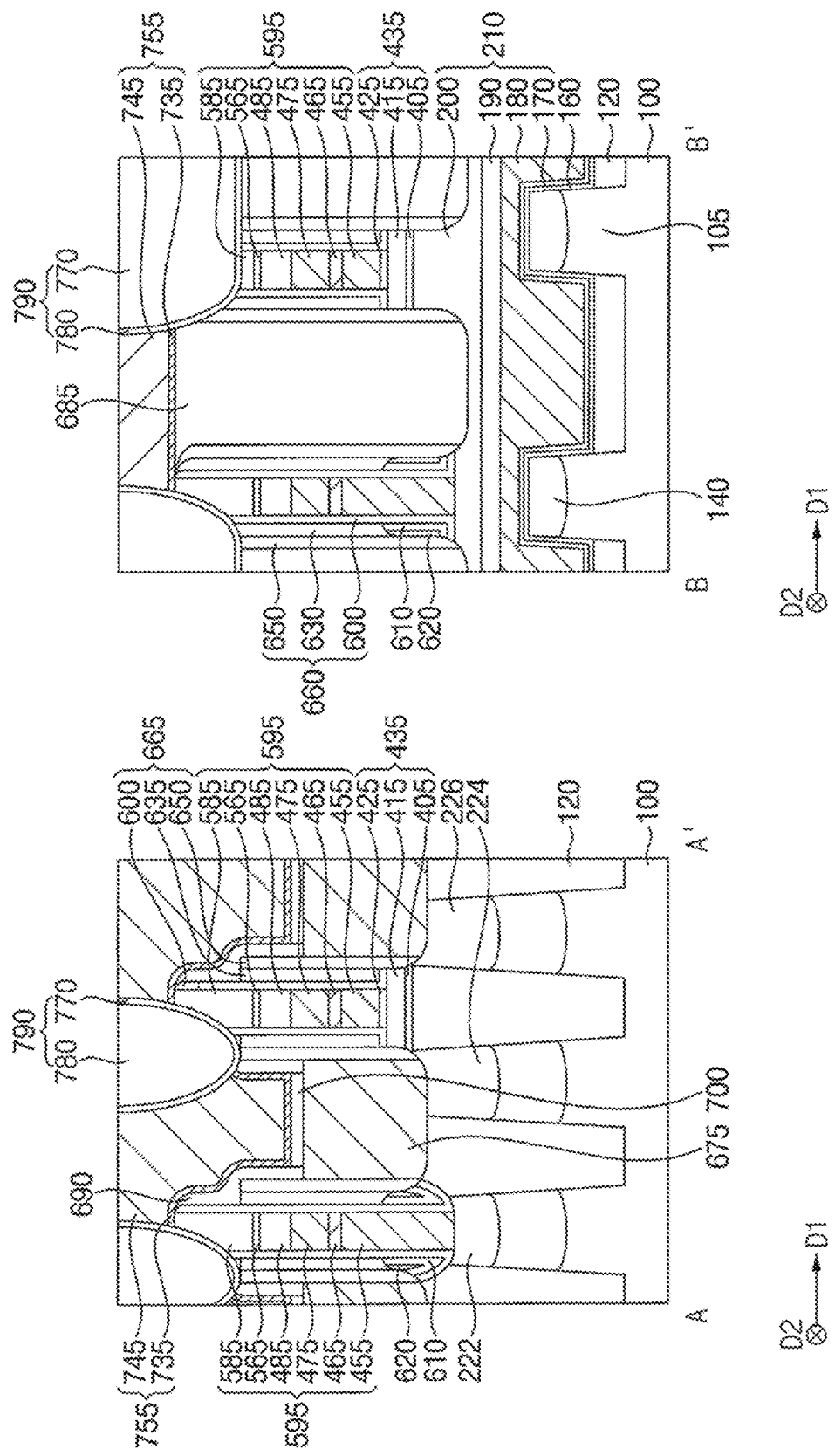

Referring to FIG. 34, the second spacer 630 included in the preliminary spacer structure 660 exposed by the eighth opening 760 may be removed to form an air gap, a sixth insulation pattern 770 may be formed on a bottom and a sidewall of the eighth opening 760, and a seventh insulation pattern 780 may be formed to fill a remaining portion of the eighth opening 760.

Each of the sixth and seventh insulation patterns 770 and 780 may include nitride (e.g., silicon nitride) or oxide (e.g., silicon oxide), and may form a second insulation pattern structure 790.

A top end of the air gap may be closed by the sixth insulation pattern 770, and thus an air spacer 635 may be formed. The first spacer 600, the air spacer 635 and the third spacer 650 may form a spacer structure 665.

Referring to FIG. 35, a second etch stop layer 800 may be formed on the upper contact plug 755 and the second insulation pattern 790, a mold layer may be formed on the second etch stop layer 800, and a ninth opening may be formed through the mold layer and the second etch stop layer 800 to expose an upper surface of the upper contact plug 755.

A lower electrode layer may be formed in the ninth opening, and may be planarized until an upper surface of the mold layer is exposed to form a lower electrode 810 having a pillar shape in the ninth opening. In some example embodiments, the lower electrode 810 may have a cup shape or a hollow cylindrical shape with a closed bottom. In some example embodiments, a plurality of lower electrodes 810 may be arranged in a honeycomb pattern in a plan view.

The mold layer may be removed by, for example, a wet etching process, a dielectric layer 820 may be formed on an upper surface and a sidewall of the lower electrode 810, and an upper electrode 830 may be formed on the dielectric layer 820. The lower electrode 810, the dielectric layer 820 and the upper electrode 830 sequentially stacked may form a capacitor 840.

The lower electrode 810 may include, for example, metal, metal nitride, metal silicide, or doped polysilicon, the dielectric layer 820 may include, for example, metal oxide, and the upper electrode 830 may include, for example, metal (e.g., titanium nitride) or doped silicon-germanium.

The semiconductor device may be manufactured by the above processes.

The semiconductor device may have following structural characteristics.

The semiconductor device may include the first active pattern 105 defined by the first isolation pattern 120 on the substrate 100, the second isolation pattern 140 at an upper portion of the first active pattern 105, the gate structure 210 extending through the first active pattern 105 and the first isolation pattern 120 in the first direction D1, at least a lower portion of which may extend through the second isolation pattern 140, the first oxide semiconductor pattern 160 including In-rich IGZO on the lower surface and the sidewall of the gate structure 210 and at least partially contacting the first and second isolation patterns 120 and 140, the first to third source/drain regions 222, 224 and 226 at the upper portion of the first active pattern 105 adjacent to the gate structure 210, the bit line structure 595 extending in the second direction D2 on the first source/drain region 222, the spacer structure 665 on the sidewall of the bit line structure 595, the contact plug structure 675, 700 and 755 on each of the second and third source/drain regions 224 and 226, and the capacitor 840 on the contact plug structure 675, 700 and 755.

In some example embodiments, a plurality of gate structures 210 may be spaced apart from each other in the second direction D2, and a plurality of first active patterns 105 may be spaced apart from each other in the first and third directions D1 and D3, each of which may extend in the third direction D3 to a given length. Two neighboring gate structures 210 in the second direction D2 may extend through each of the first active patterns 105.

In some example embodiments, the second oxide semiconductor pattern 280 including Ga-rich IGZO may be formed on the sidewall of each of the first active patterns 105 under the second and third source/drain regions 224 and 226 at upper portions of each of opposite ends in the third direction D3 of each of the first active patterns 105.

In some example embodiments, the second oxide semiconductor pattern 280 may contact the sidewall of each of the second and third source/drain regions 224 and 226.

In some example embodiments, the third isolation pattern 380 may be formed between the second oxide semiconductor pattern 280 and the active pattern 105.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A transistor structure comprising:
   an active pattern defined by a first isolation pattern on a substrate;
   a second isolation pattern at an upper portion of the active pattern;
   a gate structure extending through the active pattern and the first isolation pattern, at least a lower portion of the gate structure extending through the second isolation pattern;
   a first oxide semiconductor pattern on a lower surface and a sidewall of the gate structure, the first oxide semiconductor pattern including In-rich IGZO and at least partially contacting the first and second isolation patterns; and
   source/drain regions at the upper portion of the active pattern adjacent to the gate structure.

2. The transistor structure according to claim 1, wherein lower surfaces of the source/drain regions contact an upper surface of the second isolation pattern.

3. The transistor structure according to claim 1, wherein the source/drain regions include doped polysilicon or doped single crystalline silicon.

4. The transistor structure according to claim 1, wherein the source/drain regions include metal, metal nitride or metal silicide.

5. The transistor structure according to claim 1, wherein the first isolation pattern contacts upper and lower portions of the first oxide semiconductor pattern, and the second isolation pattern contacts the lower portion of the first oxide semiconductor pattern.

6. The transistor structure according to claim 1, wherein the gate structure is one of a plurality of gate structures, the plurality of gate structures spaced apart from each other in a first direction, each of the plurality of gate structures extending in a second direction and crossing the first direction, the first direction and the second direction being substantially parallel to an upper surface of the substrate,
   the active pattern is one of a plurality of active patterns, the plurality of active patterns spaced apart from each other in the second direction and in a third direction, the third direction parallel to the upper surface of the substrate and having an acute angle with respect to the second direction, each of the plurality of active patterns extending in the third direction to a given length, and
   two gate structures of the plurality of gate structures neighboring in the first direction extended through each of the plurality of active patterns.

7. The transistor structure according to claim 6, wherein the source/drain regions include first, second and third source/drain regions arranged in order in the third direction, the first, second, and third source/drain regions being at the upper portion of the active pattern, the upper portions of the active pattern being adjacent to the two gate structures, and
   the transistor structure further comprises a second oxide semiconductor pattern on a sidewall of each of the first and third source/drain regions, the second oxide semiconductor pattern including Ga-rich IGZO.

8. The transistor structure according to claim 7, wherein the second oxide semiconductor pattern directly contacts the sidewall of each of the first and third source/drain regions.

9. The transistor structure according to claim 7, further comprising:
   a third isolation pattern between the second oxide semiconductor pattern and the active pattern.

10. The transistor structure according to claim 9, wherein the third isolation pattern directly contacts the sidewall of each of the first and third source/drain regions.

11. A transistor structure comprising:
- an active pattern defined by an isolation pattern on a substrate, the active pattern including IGZO;
- a gate structure extending through the active pattern and the isolation pattern;
- a first oxide semiconductor pattern on a sidewall of a portion of the active pattern adjacent to the isolation pattern, the first oxide semiconductor pattern including Ga-rich IGZO; and
- source/drain regions at an upper portion of the active pattern adjacent to the gate structure.

12. The transistor structure according to claim 11, further comprising:
- a second oxide semiconductor pattern on a lower surface and a lower sidewall of a portion of the gate structure extending through the active pattern, the second oxide semiconductor pattern including In-rich IGZO.

13. The transistor structure according to claim 11, wherein the active pattern includes In-rich IGZO.

14. The transistor structure according to claim 11, wherein lower surfaces of the source/drain regions contact corresponding portions, respectively, of an upper surface of the first oxide semiconductor pattern.

15. The transistor structure according to claim 11, wherein the source/drain regions include metal, metal nitride or metal silicide.

16. A semiconductor device comprising:
- an active pattern defined by a first isolation pattern on a substrate;
- a second isolation pattern at an upper portion of the active pattern;
- a gate structure extending through the active pattern and the first isolation pattern, at least a lower portion of the gate structure extending through the second isolation pattern in a first direction, the first direction being substantially parallel to an upper surface of the substrate;
- a first oxide semiconductor pattern on a lower surface and a sidewall of the gate structure, the first oxide semiconductor pattern including In-rich IGZO and at least partially contacting the first and second isolation patterns;
- source/drain regions at the upper portion of the active pattern adjacent to the gate structure;
- a bit line structure on one of the source/drain regions and extending in a second direction, the second direction being substantially parallel to the upper surface of the substrate and substantially perpendicular to the first direction;
- a spacer structure on a sidewall of the bit line structure;
- a contact plug structure on one of the source/drain regions; and
- a capacitor on the contact plug structure.

17. The semiconductor device according to claim 16, wherein:
- the gate structure is one of a plurality of gate structures spaced apart from each other in the second direction,
- the active pattern is one of a plurality of active patterns spaced apart from each other in the first direction and in a third direction, the third direction substantially parallel to the upper surface of the substrate and having an acute angle with respect to the first direction, each of the plurality of active patterns extending in the third direction to a given length, and
- two gate structures of the plurality of gate structures neighboring in the second direction extend through each of the plurality of active patterns.

18. The semiconductor device according to claim 17, wherein:
- the source/drain regions include first, second and third source/drain regions arranged in order in the third direction, the first, second and third source/drain regions being at the upper portion of the active pattern adjacent to the two gate structures,
- the bit line structure is on the second source/drain region,
- the contact plug structure is on each of the first and third source/drain regions, and
- the semiconductor device further comprises a second oxide semiconductor pattern on a sidewall of each of the plurality of active patterns under the first and third source/drain regions, the second oxide semiconductor pattern including Ga-rich IGZO.

19. The semiconductor device according to claim 18, wherein the second oxide semiconductor pattern directly contacts a sidewall of each of the first and third source/drain regions.

20. The semiconductor device according to claim 18, further comprising:
- a third isolation pattern between the second oxide semiconductor pattern and the active pattern.

* * * * *